(12) United States Patent
Kazama

(10) Patent No.: US 8,405,113 B2
(45) Date of Patent: Mar. 26, 2013

(54) SEMICONDUCTOR LIGHT-EMITTING DEVICE

(75) Inventor: Takuya Kazama, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 34 days.

(21) Appl. No.: 13/194,056

(22) Filed: Jul. 29, 2011

(65) Prior Publication Data
US 2012/0025251 A1 Feb. 2, 2012

(30) Foreign Application Priority Data
Jul. 30, 2010 (JP) ................................ 2010-171779

(51) Int. Cl.
*H01L 33/22* (2010.01)
(52) U.S. Cl. ................ 257/98; 257/86; 257/95; 257/99; 257/E33.067; 257/E33.074
(58) Field of Classification Search ............... 257/86, 257/95, 98, 99, E33.011, E33.065, E33.067, 257/E33.074
See application file for complete search history.

(56) References Cited

U.S. PATENT DOCUMENTS

| 7,897,420 | B2 * | 3/2011 | Chu et al. ................ 438/29 |
| 2006/0204865 | A1 * | 9/2006 | Erchak et al. ............. 430/7 |
| 2007/0257269 | A1 * | 11/2007 | Cho et al. ................ 257/95 |
| 2007/0295981 | A1 * | 12/2007 | Erchak et al. ............. 257/98 |
| 2010/0072501 | A1 * | 3/2010 | Wakai et al. ............. 257/98 |
| 2010/0264443 | A1 * | 10/2010 | Wakai et al. ............. 257/98 |
| 2011/0101400 | A1 * | 5/2011 | Chu et al. ............... 257/98 |
| 2011/0198647 | A1 * | 8/2011 | Kazama .................. 257/98 |

FOREIGN PATENT DOCUMENTS

| JP | 2002-217450 A | 8/2002 |
| JP | 2008-103627 A | 5/2008 |

* cited by examiner

*Primary Examiner* — Kenneth Parker
*Assistant Examiner* — Yu Chen
(74) *Attorney, Agent, or Firm* — Holtz, Holtz, Goodman & Chick, P.C.

(57) ABSTRACT

A semiconductor light-emitting device includes a reflective electrode on a support; a first cladding layer; a light-emitting layer; a second cladding layer having a terrace structure formed of recesses and protrusions, a light-extracting structure having projections and depressions being formed on top surfaces of the protrusions and bottom surfaces of the recesses; and surface electrodes on the top surfaces of the protrusions. The second cladding layer has a stacked structure, which includes a first current-spreading layer, a first light-extracting layer on the first current-spreading layer and having the light-extracting structure on the bottom surfaces of the recesses, a second current-spreading layer on the first light-extracting layer, and a second light-extracting layer on the second current-spreading layer and having the light-extracting structure on the top surfaces of the protrusions, and the first and second light-extracting layer have lower light absorptance and higher resistance than the first and second current-spreading layer.

8 Claims, 13 Drawing Sheets

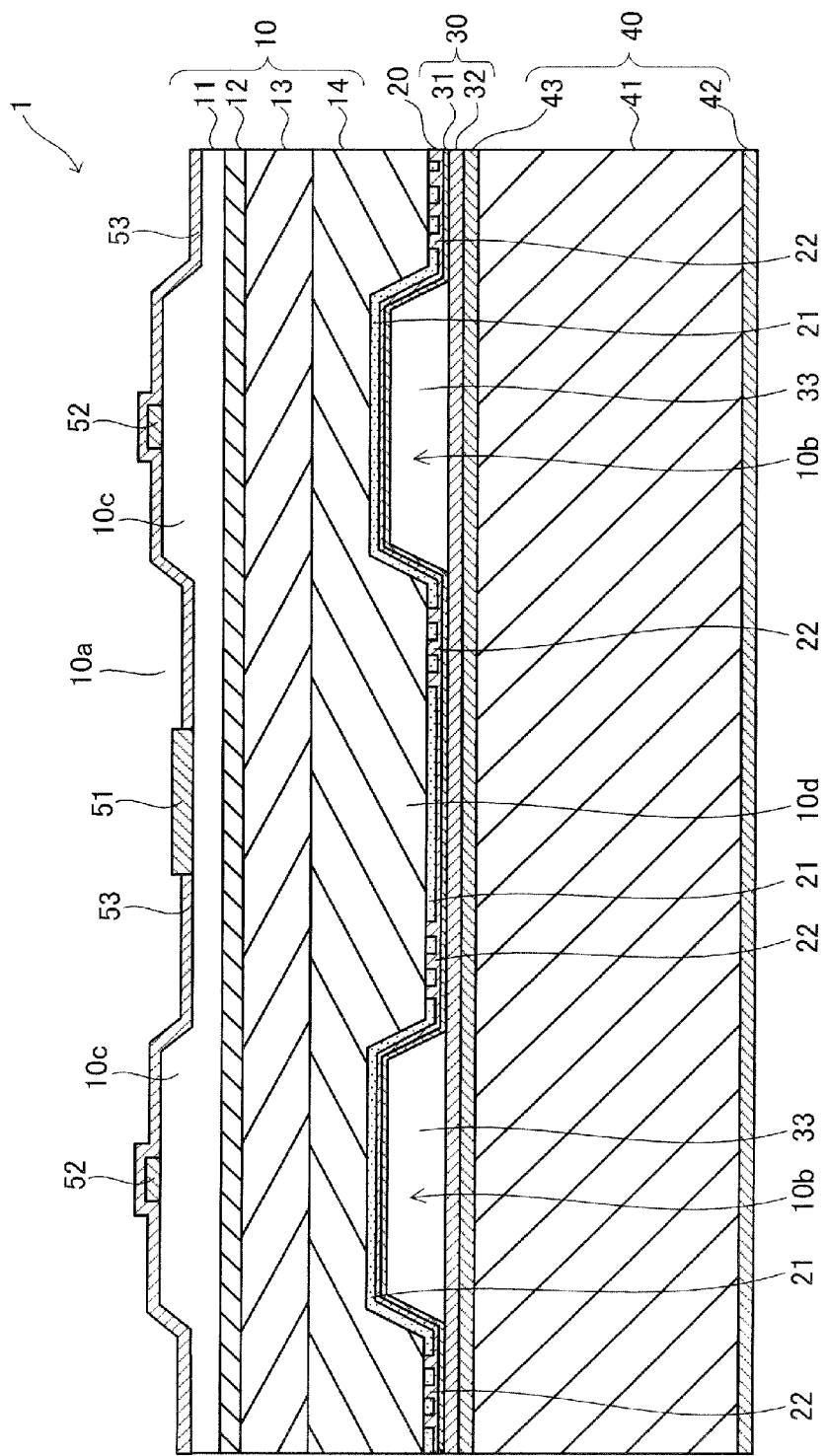

SEMICONDUCTOR LIGHT-EMITTING DEVICE

BACKGROUND OF THE INVENTION

1. Technical Field

The present invention relates to a semiconductor light-emitting device, such as a light emitting diode (LED), and particularly to a technique for improving light-extracting efficiency.

2. Description of the Related Art

In a light emitting diode (LED) made of an AlGaInP-based material, the band gap of a GaAs substrate used for crystal growth is smaller than the band gap of a light-emitting layer. In this case, all the light emitted from the light-emitting layer cannot be extracted, that is, part of the light directed toward a light-extracting surface can be extracted, whereas the light directed toward the GaAs substrate is absorbed therein.

Japanese Laid-open Patent Publication No. 2002-217450 (hereinafter also referred to as Patent Document 1) discloses an LED manufactured by forming a semiconductor film made of an AlGaInP-based material on a GaAs substrate, which is a substrate for crystal growth (or growth substrate), attaching the semiconductor film to a support substrate via a reflective film made of a high-reflectance metal, and then removing the GaAs substrate. According to such an LED configuration that has no substrate for crystal growth, the light emitted from the light-emitting layer is not absorbed in the GaAs substrate but the light directed away from the light-extracting surface (i.e., toward the support substrate) is reflected off the reflective film, whereby the light-extracting efficiency is improved in the so-configured LED as compared with that in the related art.

However, light incident on the interface between the semiconductor film and a surrounding medium, such as air or a resin, at an angle of incidence greater than or equal to a critical angle will be completely reflected by total reflection and hence will not be extracted from the semiconductor film. The light that has not been extracted from the semiconductor film is repeatedly reflected therein; i.e., is reflected multiple times. The intensity of the light propagating in the semiconductor film decreases exponentially with the propagation distance (or optical path length). Specifically, the light reflected multiple times in the semiconductor film is absorbed therein (self-absorbed), and it is therefore difficult to extract the light out of the semiconductor film. For example, when an AlGaInP-based semiconductor film, which has a refractive index of 3.3, is encapsulated in a resin having a refractive index of 1.5, the critical angle is 27° and the reflectance at the interface between the semiconductor film and the resin is about 15%. In this case, the light that can be extracted from the semiconductor film is limited to about 4.5%.

Japanese Laid-open Patent Publication No. 2008-103627 (hereinafter also referred to as Patent Document 2) discloses a semiconductor light-emitting element having projections and depressions formed on a light-extracting surface of a semiconductor film. In the thus configured semiconductor light-emitting element, the light directed toward the light-extracting surface is scattered and diffracted by the projections and depressions, and the amount of reflection light due to total reflection at the interface between the light-extracting surface and the surrounding medium can be reduced, whereby the light-extracting efficiency can be improved. Patent Document 2 further describes that the projections and depressions are formed not to make the semiconductor film thin. The reason for this is that when the semiconductor film is thin, the series resistance thereof becomes high and the current therethrough spreads or diffuses insufficiently. Specifically, when the current spreads insufficiently in the semiconductor film, current density increases only in part of the semiconductor film. When the current density in the semiconductor film becomes higher than a threshold, carriers injected into the light-emitting layer overflow, resulting in decrease in the number of carriers that contribute to light emission and hence decrease in the light emitting efficiency. It is therefore necessary to spread the current over a wide area in the semiconductor film by making the semiconductor film thicker than a certain value.

Forming projections and depressions on the light-extracting surface side allows more light to be extracted from the semiconductor film, but the light reflected multiple times in the semiconductor film still exists. As described above, to encourage the spread of current in the semiconductor film, it is necessary to make the semiconductor film thicker than a certain value, but a thicker semiconductor film increases the propagation distance (or optical path length) of the light reflected multiple times in the semiconductor film and hence the amount of self-absorption increases, resulting in decrease in the light-extracting efficiency. Specifically, it has been difficult to reduce the amount of self-absorption of the light propagating in the semiconductor film without hampering or obstructing the spread of the current in the semiconductor film.

The present invention has been contrived in view of the circumstances described above. An object of the invention is to provide a semiconductor light-emitting device capable of minimizing the amount of self-absorption of light propagating in a semiconductor film without hampering or obstructing the spread of current in the semiconductor film.

SUMMARY OF THE INVENTION

To achieve the objects described above, a semiconductor light-emitting device according to the invention includes a reflective electrode provided on a support and forming a reflective surface; a first cladding layer provided on the reflective electrode; a light-emitting layer provided on the first cladding layer; a second cladding layer provided on the light-emitting layer and having a terrace structure formed of recesses and protrusions, a light-extracting structure having projections and depressions being formed on top surfaces of the protrusions and bottom surfaces of the recesses; and surface electrodes provided on the top surfaces of the protrusions. The second cladding layer has a stacked structure on the light-emitting layer, the stacked structure including a first current-spreading layer, a first light-extracting layer provided on the first current-spreading layer and having the light-extracting structure formed on the bottom surfaces of the recesses, a second current-spreading layer provided on the first light-extracting layer, and a second light-extracting layer provided on the second current-spreading layer and having the light-extracting structure formed on the top surfaces of the protrusions, and the first light-extracting layer and the second light-extracting layer have lower light absorptance and higher resistance than the first current-spreading layer and the second current-spreading layer.

The semiconductor light-emitting device according to the present invention has a stacked structure in which a first cladding layer, a light-emitting layer, and a second cladding layer are stacked. The second cladding layer provided on the light-extracting surface side has a terrace structure formed of recesses and protrusions. A light-extracting structure having projections and depressions is formed on top surfaces of the protrusions and bottom surfaces of the recesses. Further, the second cladding layer is formed of a first current-spreading layer, a first light-extracting layer provided on the first current-spreading layer and having the light-extracting structure formed on the bottom surfaces of the recesses, a second current-spreading layer provided on the first light-extracting layer, and a second light-extracting layer provided on the second current-spreading layer and having the light-extracting structure formed on the top surfaces of the protrusions. The first and second light-extracting layers have lower light absorptance but higher resistance than the first and second current-spreading layers. According to the thus configured semiconductor light-emitting device of the invention, the light emission distribution can be made uniform by enhanced current spreading, and the light-extracting efficiency can be improved at the same time. Specifically, according to the semiconductor light-emitting device of the invention, the amount of self-absorption of light propagating in a semiconductor film formed of the first cladding layer, the light-emitting layer, and the second cladding layer can be reduced without hampering or obstructing the spread of current in the semiconductor film.

BRIEF DESCRIPTION OF THE DRAWINGS

FIG. 2 is a cross-sectional view taken along the line 2-2 (indicated by dashed line) in FIG. 1;

DETAILED DESCRIPTION OF THE INVENTION

Figure 1:
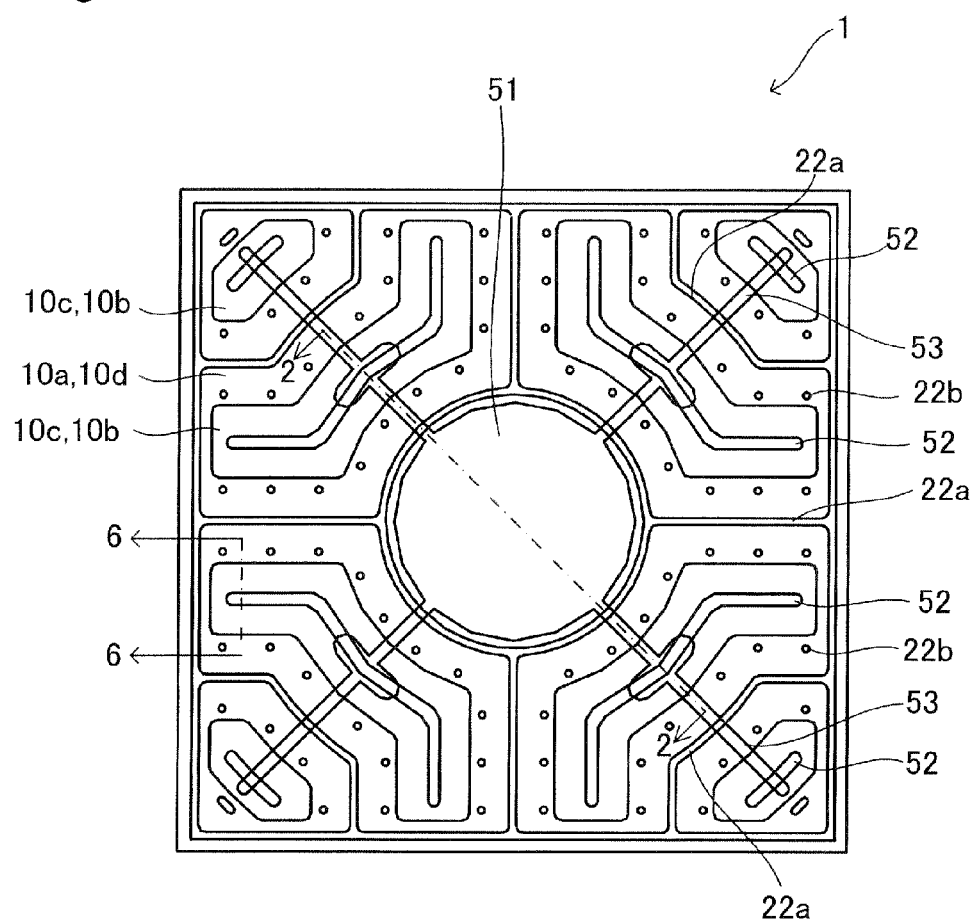
FIG. 1 is a plan view of a semiconductor light-emitting device according to a first embodiment of the invention.

Embodiments according to the present invention will be described below in detail with reference to the accompanying drawings. In the following drawings, substantially the same or equivalent components and portions have the same reference characters.

First Embodiment

The structure of a semiconductor light-emitting device according to a first embodiment of the invention will first be described with reference to FIGS. 1 to 8.

FIG. 1 is a plan view of the semiconductor light-emitting device according to the present embodiment. FIG. 2 is a cross-sectional view taken along the line 2-2 (indicated by dashed line) in FIG. 1. The semiconductor light-emitting device 1 includes a semiconductor film 10, a reflective film 20, a bonding film 30, a support 40, Schottky electrodes 51, ohmic electrodes 52, and connection wiring lines 53, as shown in FIGS. 1 and 2. The semiconductor light-emitting device 1 has a laminated or bonded structure in which the semiconductor film 10 is bonded to the support 40 with the reflective film 20 and the bonding film 30 therebetween.

The semiconductor film 10 has a structure in which an n-type cladding layer 11, a light-emitting layer 12, a p-type cladding layer 13, and a p-type contact layer 14 are sequentially stacked in the stated order from the light-extracting surface side. The overall thickness of the semiconductor film 10 is, for example, 5.6 μm, and the external shape of a principal plane of the semiconductor film 10 is, for example, a square each side of which is 300 μm in length. The thickness of the n-type cladding layer 11 is about 2.4 μm and the structure thereof will be described later. The light-emitting layer 12 has a multi-quantum-well structure in which a well layer composed of $(Al_{0.1}Ga_{0.9})_{0.5}In_{0.5}P$ and having a thickness of about 20 nm and a barrier layer composed of $(Al_{0.56}Ga_{0.44})_{0.5}In_{0.5}P$ and having a thickness of about 10 nm are alternately stacked repeatedly 15 times. The p-type cladding layer 13 is made, for example, of $(Al_{0.7}Ga_{0.3})_{0.5}In_{0.5}P$ and has a thickness of 1 μm. The p-type contact layer 14 is made, for example, of $Ga_{0.9}In_{0.1}P$ and has a thickness of 1.5 μm.

The semiconductor film 10 has recesses 10$a$, 10$b$ and protrusions 10$c$, 10$d$ formed by partially removing superficial regions of the semiconductor film 10 on the light-extracting surface side (i.e., the n-type cladding layer 11 side) and superficial regions of the semiconductor film 10 on the reflective surface side (i.e., the p-type contact layer 14 side), which is opposed to the light-extracting surface. Each of the recesses 10$a$ on the light-extracting surface side is recessed toward the reflective surface. Each of the recesses 10$b$ on the reflective surface side is recessed toward the light-extracting surface and has a flat bottom. The recesses 10$a$ and 10$b$ are so formed that they do not reach the light-emitting layer 12. As a result, the n-type cladding layer 11 stacked on the light-extracting surface side of the semiconductor film 10 has a terrace structure formed of the recesses 10$a$ and the protrusions 10$c$, and the p-type contact layer 14 stacked on the reflective surface side of the semiconductor film 10 has a terrace structure formed of the recesses 10$b$ and the protrusions 10$d$. In other words, the semiconductor film 10 has the terrace structures on the light-extracting surface side and the reflective surface side.

The reflective film 20 is provided to cover the surface of the p-type contact layer 14 having the recesses 10b and the protrusions 10d formed thereon. The reflective film 20 is, for example, formed of a dielectric film 21 made of $SiO_2$ and a reflective electrode 22 made of AuZn. The reflective electrode 22 is in contact with the semiconductor film 10 through openings in the dielectric film 21, and ohmic contact is formed between the reflective electrode 22 and the semiconductor film 10. The reflective film 20 formed of the dielectric film 21 and the reflective electrode 22 forms a reflective surface that extends along the interface between the reflective film 20 and the semiconductor film 10 and reflects light emitted from the light-emitting layer 12 toward the light-extracting surface. The dielectric film 21 divides the reflective electrode 22 into linear line electrodes 22a and island-shaped dot electrodes 22b in the vicinity of the interface between the dielectric film 21 and the p-type contact layer 14 as shown in FIG. 3B. The line electrodes 22a and the dot electrodes 22b are in contact with each other under the dielectric film 21 and electrically connected to each other. Forming the reflective electrode 22 with the line electrodes 22a and the dot electrodes 22b prevents current concentration and allows current density in the semiconductor film 10 to be uniform. Further, the line electrodes 22a and the dot electrodes 22b are so formed to be disposed on the surfaces of the protrusions 10d on the reflective surface side. Specifically, the line electrodes 22a and the dot electrodes 22b are not formed in the recesses 10b on the reflective surface side. Moreover, the line electrodes 22a and the dot electrodes 22b are positioned not to overlap with the ohmic electrodes 52 on the light-extracting surface side in the thickness direction of the semiconductor film 10. Specifically, the reflective electrode 22 is in contact with the semiconductor film 10 in positions that do not overlap with surface electrodes (ohmic electrodes 52) in the thickness direction of the semiconductor film 10 and forms what is called a counter electrode configuration (or a staggered electrode configuration). The dielectric film 21 is not necessarily made of $SiO_2$ but can alternatively be made of $Si_3N_4$, $Al_2O_3$, or any other transparent dielectric material. The reflective electrode 22 is also not necessarily made of AuZn but can alternatively be made of any material having high optical reflectance and capable of forming ohmic contact with the p-type contact layer 14.

In the first embodiment of the invention, in which the dielectric film 21 is made of $SiO_2$ and the reflective electrode 22 is made of AuZn (coverage: about 85%), the reflectance on the reflective surface side is about 94%, and it is preferable to maximize the reflectance of the reflective surface. It is also preferable to increase specular reflectance when a light-extracting structure, which will be described later, is provided on the light-extracting surface side.

A first bonding layer 31 formed of a barrier metal layer and a eutectic solder layer is provided on the reflective film 20. A second bonding layer 32 is so provided that part thereof is in contact with the first bonding layer 31. Voids or cavities 33 are formed in portions where the first bonding layer 31 and the second bonding layer 32 are not in contact with each other. Specifically, the cavities 33 are present in the recesses 10b of the semiconductor film 10. The first bonding layer 31 and the second bonding layer 32 form the bonding film 30. The barrier metal layer can, for example, be formed of a single layer or two or more layers containing Ta, Ti, W, and other refractory metals or nitrides thereof. The barrier metal layer prevents Zn contained in the reflective electrode 22 from diffusing out thereof and prevents a eutectic bonding material (AuSn, for example) contained in the second bonding layer 32 from diffusing into the reflective electrode 22. The eutectic solder layer contains, for example, Ni and Au, which serve to improve wettability with the eutectic bonding material contained in the second bonding layer 32 when the first bonding layer 31 is boned to the second bonding layer 32. The support 40 can therefore be bonded to the semiconductor film 10 in a satisfactory manner. The second bonding layer 32 is a metal layer containing Ti, Ni, AuSn, and other substances.

The Schottky electrodes 51 and the ohmic electrodes 52, which form the surface electrodes, are formed on the surface of the n-type cladding layer 11, which serves as the light-extracting surface. The Schottky electrodes 51 form bonding pads and can be made of a material that can form Schottky contact with the n-type cladding layer 11, for example, Ta, Ti, W, or an alloy thereof. The Schottky electrodes 51 are not necessarily made of a metal material but can be made of $SiO_2$ or any other suitable insulating dielectric. Further, an Au layer may be formed on the outermost surface of each of the Schottky electrodes 51 to improve wire bonding and conductive characteristics. The Schottky electrodes 51 are formed on the surfaces of the regions where the recesses 10a (i.e., bottom surfaces of recesses 10a) on the light-extracting surface side, which has a terrace structure, of the semiconductor film 10 are formed. The ohmic electrodes 52 are made of a material that can form ohmic contact with the n-type cladding layer 11, for example, AuGeNi, AuSn, AuSnNi, or the like. The ohmic electrodes 52 are formed on the surfaces (i.e., top surfaces) of the protrusions 10c on the light-extracting surface side of the semiconductor film 10. The Schottky electrodes 51 and the ohmic electrodes 52 are electrically connected to each other with the connection wiring lines 53, which physically connect the electrodes. The connection wiring lines 53 are made of the same material as that of the Schottky electrodes 51 and form Schottky contact with the n-type cladding layer 11. Since the Schottky electrodes 51 form Schottky contact with the n-type cladding layer 11, no current flows through the portions of the semiconductor film 10 that are immediately below the Schottky electrodes 51. Further, the reflective electrode 22 on the reflective surface side and the ohmic electrodes 52 formed on the light-extracting surface side are positioned not to overlap with each other in the thickness direction (or stacking direction) of the semiconductor film 10. The recesses 10a on the light-extracting surface side are formed above the reflective electrode 22, and the indentations on the reflective surface side that form the recesses 10b on the reflective surface side are formed below the ohmic electrodes 52. Specifically, the current flows between the ohmic electrodes 52 on the light-extracting surface side and the reflective electrode 22 on the reflective surface side.

The support 40 is formed of a support substrate 41 and ohmic metal layers 42 and 43 formed on the opposite surfaces of the support substrate 41. The support substrate 41 is a Si substrate that is made to be conductive, for example, by adding a p-type impurity in high concentration. The ohmic metal layers 42 and 43 are made, for example, of Pt. The second bonding layer 32 is disposed on the ohmic metal layer 43. The support substrate 41 is not necessarily made of Si but can be made of Ge, Al, Cu, or any other suitable conductive material.

In FIG. 1, the Schottky electrodes 51 and the ohmic electrodes 52, which form the surface electrodes on the light-extracting surface side, and the line electrodes 22a and the dot electrodes 22b, which form the reflective electrode 22 on the reflective surface side, are shown to be arranged in the same plane. The line electrodes 22a and the dot electrodes 22b on the reflective surface side are disposed on both sides of and along each of eight electrodes pieces that form the ohmic electrodes 52 on the light-extracting surface side. In other words, the line electrodes 22a on the reflective surface side are formed to surround the electrode pieces that form the ohmic electrodes 52 on the light-extracting surface side, and each of the electrode pieces is disposed at the center of the region surrounded by the corresponding line electrodes 22a on the reflective surface side. Specifically, the ohmic electrodes 52 on the light-extracting surface side and the line electrodes 22a and the dot electrodes 22b on the reflective surface side are arranged not to overlap with each other in the thickness direction (or stacking direction) of the semiconductor film 10 and form what is so called a counter electrode. Forming the counter electrodes allows the current to spread widely in the semiconductor film 10 even when the areas of the ohmic electrodes 52 on the light-extracting surface side are reduced. The electrode coverage over the light-extracting surface can therefore be reduced, whereby light-extracting efficiency can be improved. Forming the counter electrode further allows the areas of the recesses 10a on the light-extracting surface side and the recesses 10b on the reflective surface side to be increased in consideration of current paths, which will be described later.

Figure 3A:
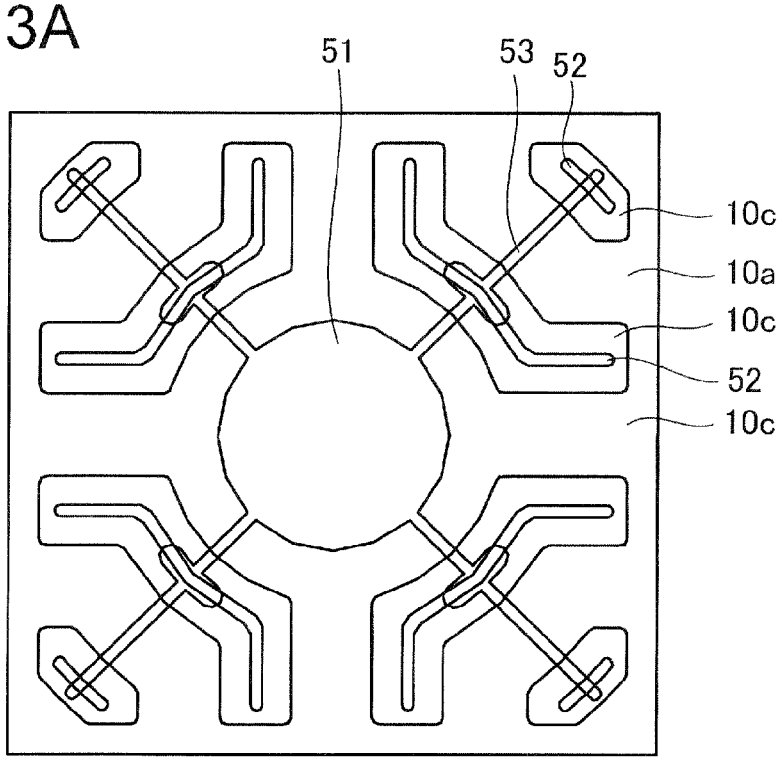
FIG. 3A is a plan view showing the configuration of a terrace structure and surface electrodes on a light-extracting surface side.
Figure 3B:
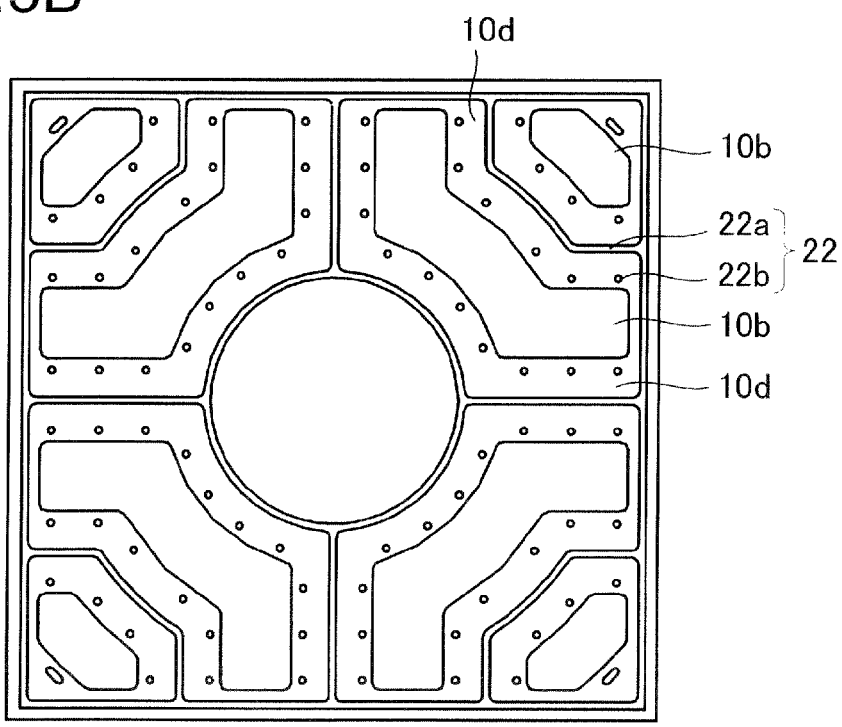
FIG. 3B is a plan view showing the configuration of a terrace structure and a reflective electrode on a reflective surface side.

FIG. 3A shows the configuration of the recesses 10a, the protrusions 10c, the ohmic electrodes 52, the Schottky electrodes 51, and the connection wiring lines 53 formed on the surface of the semiconductor film 10 on the light-extracting surface side. FIG. 3B shows the configuration of the recesses 10b, the protrusions 10d, and the reflective electrode 22 formed on the surface of the semiconductor film 10 on the reflective surface side. In the present embodiment, the contour of each recess 10a on the light-extracting surface side and the contour of the corresponding protrusion 10d on the reflective surface side have the same shape or coincide with each other in the thickness direction of the semiconductor film 10. Similarly, the contour of each protrusion 10c on the light-extracting surface side and the contour of the corresponding recess 10b on the reflective surface side have the same shape or coincide with each other in the thickness direction of the semiconductor film 10.

[Relationship Between Terrace Structure and Current Path]

As described above, the semiconductor film 10 has the recesses 10a, 10b and the protrusions 10c, 10d formed by partially removing superficial regions of the semiconductor film 10 on the light-extracting surface side and superficial regions of the semiconductor film 10 on the reflective surface side, which is opposed to the light-extracting surface side. In other words, the portions of the semiconductor film 10 that have been removed correspond to the recesses 10a and 10b, and the portions of the semiconductor film 10 that have not been removed correspond to the protrusions 10c and 10d.

Figure 4A:
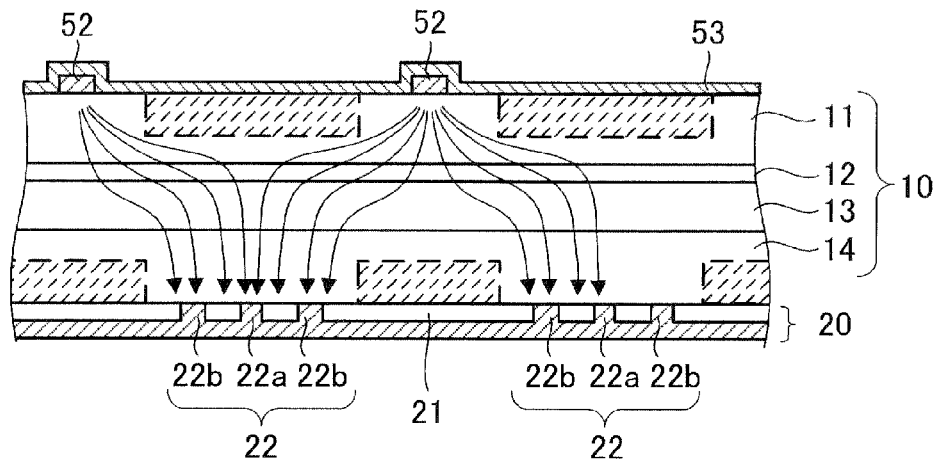
FIG. 4A is a cross-sectional view showing current paths established when a counter electrode is formed.

As shown in FIG. 4A, the reflective electrode 22 formed of the line electrodes 22a and the dot electrodes 22b surrounds the ohmic electrodes 52 on the light-extracting surface side, and the current flows from the ohmic electrodes 52 on the light-extracting surface side and spreads rightward and leftward to the reflective electrode 22 through the semiconductor film 10. Forming the counter electrode described above creates superficial regions (or regions in the vicinity to the surfaces) of the semiconductor film 10 that do not include current paths on the light-extracting surface side and the reflective surface side, that is, regions that do not contribute to current spreading (see, hatched regions in FIG. 4A). It is noted that, for ease of illustration, the semiconductor film 10 shown in FIG. 4A has no terrace structure.

Figure 4B:
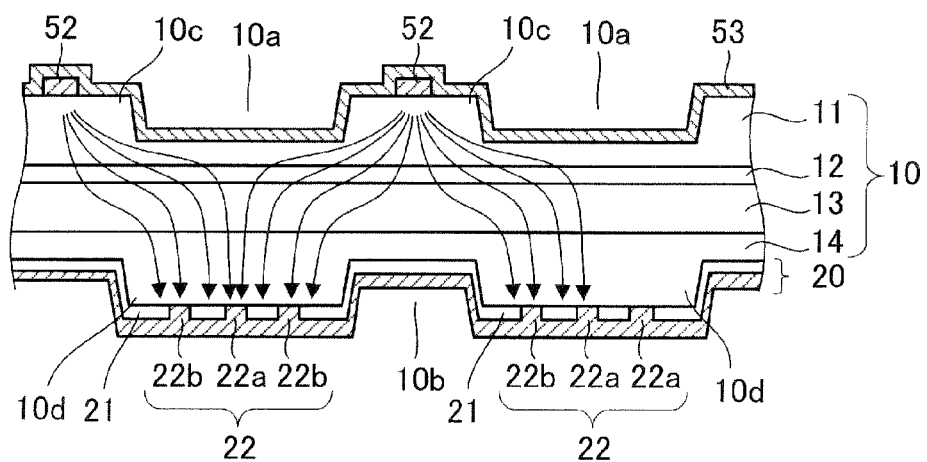
FIG. 4B is a cross-sectional view showing the terrace structure and the current paths in the first embodiment of the invention.

As shown in FIG. 4B, in the semiconductor light-emitting device 1 according to the present embodiment, the recesses 10a on the light-extracting surface side and the recesses 10b on the reflective surface side are formed by removing the portions of the semiconductor film 10 that do not contribute to current spreading shown in FIG. 4A. In other words, the recesses 10a and 10b are so positioned not to intersect the current paths formed between the ohmic electrodes 52 on the light-extracting surface side and the reflective electrode 22. Above or below the portions having been removed from the semiconductor film 10, the distance between the reflective surface and the light-extracting surface (or optical path length) is shortened, whereby the amount of self-absorption of the light reflected multiple times in the semiconductor film 10 can be reduced and hence the light-extracting efficiency can be improved. Since the portions having been removed from the semiconductor film 10 include no current paths, the spread of the current will not be blocked in the semiconductor film 10. As described above, partially reducing the thickness of the semiconductor film 10 by removing the portions of the semiconductor film 10 that do not contribute to the spread of the current allows the amount of self-absorption of the light propagating through the semiconductor film 10 to be reduced without blocking the spread of current.

[Configuration of Terrace Structure on Light-Extracting Surface Side]

Figure 5:
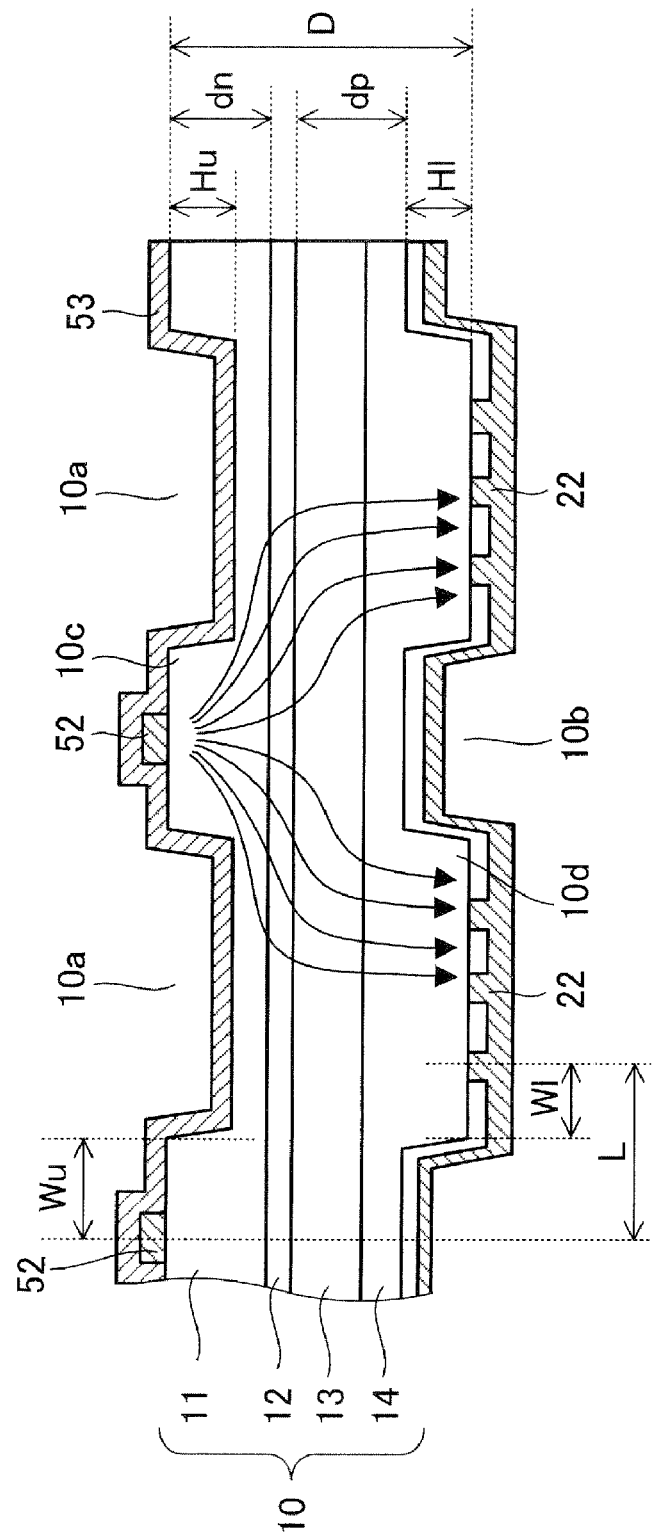
FIG. 5 is a cross-sectional view showing the configuration of a terrace structure according to an embodiment of the invention.

The ohmic electrodes 52 on the light-extracting surface side are formed on the surfaces of the protrusions 10c on the light-extracting surface side of the semiconductor film 10. The recesses 10a on the light-extracting surface side are disposed in the regions immediately above the portions where the reflective electrode 22 is in contact with the semiconductor film 10. The ratio (or area ratio) of the recesses 10a to the entire surface of the semiconductor film 10 on the light-extracting surface side is preferably 15% or greater, more preferably 30% or greater. When each recess 10a has too small an area, the light-extracting efficiency does not improve greatly, whereas when each recess 10a has too large an area, the recesses 10b block the current paths and hence hamper or obstruct the spread of the current. As shown in FIG. 5, the distance Wu from each ohmic electrode 52 on the light-extracting surface side to an end of the adjacent recess 10a is set at 30 to 70% of the horizontal distance L from the ohmic electrode 52 on the light-extracting surface side to the reflective electrode 22 on the reflective surface side below the recess 10a, preferably 40 to 60% of the horizontal distance L. The horizontal distance used herein is the distance defined by projecting the ohmic electrode 52 on the light-extracting surface side and the reflective electrode 22 on the reflective surface side on the same plane parallel to the principal plane of the semiconductor film 10. The depth Hu of each recess 10a on the light-extracting surface side is preferably at least 15% of the overall thickness D of the semiconductor film 10 but 25 to 75% of the thickness "dn" of the n-type cladding layer 11. When the semiconductor film 10 includes another layer of n-type conductivity as well as the n-type cladding layer 11, "dn" means the sum of the thicknesses of all layers of n-type conductivity. The regions where the recesses 10a are formed are regions that do not contribute to the current spreading, but removing the n-type cladding layer 11 to the depth where the light-emitting layer 12 is reached causes no carriers to be injected into the light-emitting layer 12 through the portions where the n-type cladding layer 11 has been completely removed, resulting in non-emission regions. It is therefore preferable not to remove the n-type cladding layer 11 completely.

[Configuration of Terrace Structure on Reflective Surface Side]

Reflective electrodes 22 are formed on the surfaces of the protrusions 10d on the reflective surface side of the semiconductor film 10. The protrusions 10d are bonded to the support 40 via the reflective film 20 and the bonding film 30. The recesses 10b on the reflective surface side are formed in the regions immediately below the ohmic electrodes 52 on the light-extracting surface side. The cavities 33 are formed on the bottom surfaces of the recesses 10b on the reflective surface side.

The Schottky electrodes 51 on the light-extracting surface side are disposed above the protrusions 10d on the reflective surface side, and the recesses 10b on the reflective surface side are formed not to be positioned immediately below the Schottky electrodes 51. The reason for this is that if the recesses 10b on the reflective surface side were present immediately below bonding pads, which are the Schottky electrodes 51, the semiconductor film 10 may be damaged when a bonding tool presses any of the bonding pads.

The ratio (or area ratio) of the recesses 10b to the entire surface of the semiconductor film 10 on the reflective surface side is preferably 15 to 50%. When each recess 10b on the reflective surface side has too small an area, the light-extracting efficiency does not improve greatly, whereas when each recess 10b has too large an area, the spread of the current is hampered and the mechanical strength of the semiconductor film 10 decreases, resulting in a reliability problem. As shown in FIG. 5, the distance W1 from an end of each recess 10b to the adjacent reflective electrode 22 is set at 30 to 70% of the horizontal distance L from the ohmic electrode 52 on the light-extracting surface side above the recess 10b to the reflective electrode 22 on the reflective surface side, preferably 40 to 60% of the horizontal distance L. The depth H1 of each recess 10b on the reflective surface side is preferably at least 15% of the overall thickness D of the semiconductor film 10 but 25 to 75% of the thickness "dp", which is the sum of the thickness of the p-type contact layer 14 and the thickness of the p-type cladding layer 13. When the semiconductor film 10 includes another layer of p-type conductivity as well as the p-type contact layer 14 and the p-type cladding layer 13, "dp" means the sum of the thicknesses of all layers of p-type conductivity. The regions where the recesses 10b are formed are regions that do not contribute to the current spreading, but removing the p-type contact layer 14 and the p-type cladding layer 13 to the depth where the light-emitting layer 12 is reached causes no carriers to be injected into the light-emitting layer 12 through the portions where the p-type contact layer 14 and the p-type cladding layer 13 have been completely removed, resulting in non-emission regions. It is therefore preferable not to remove the p-type cladding layer 13 completely.

[Structure of N-Type Cladding Layer 11]

Figure 6A:
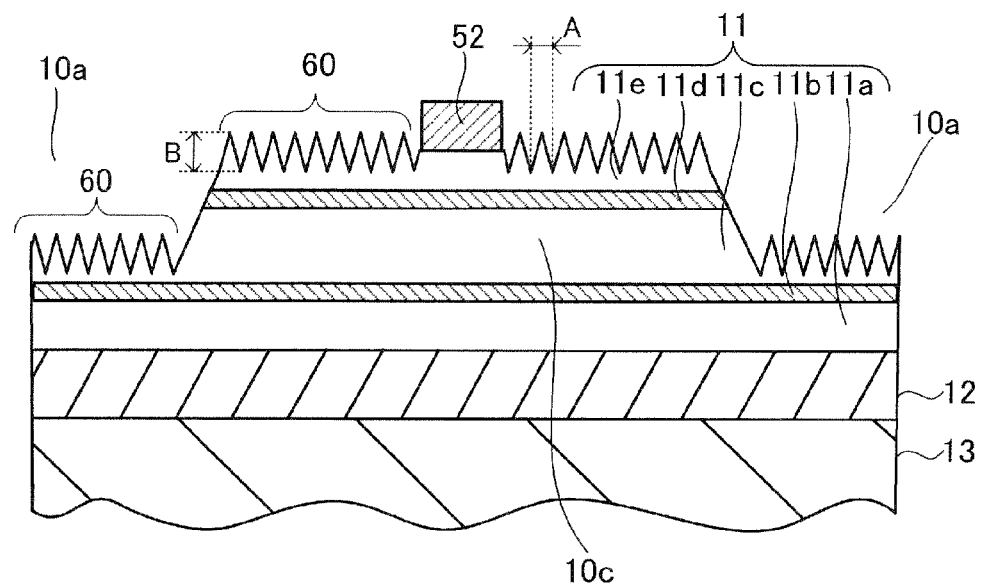
FIG. 6A is a cross-sectional view showing the structure of an n-type cladding layer according to the first embodiment of the invention.
Figure 6B:
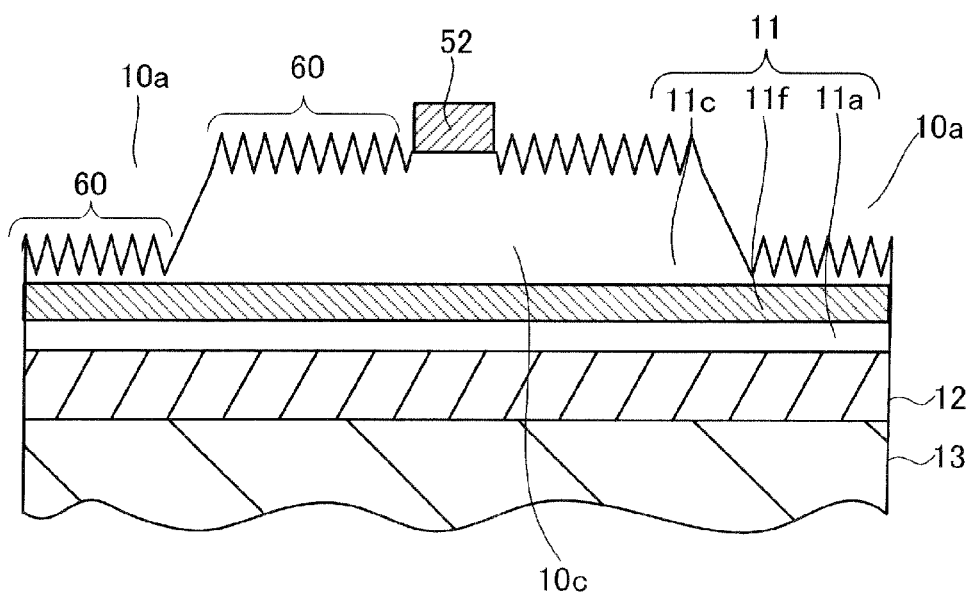
FIG. 6B is a cross-sectional view showing the structure of another n-type cladding layer according to a comparative example.

The structure of the n-type cladding layer 11 will next be described in detail with reference to FIGS. 6A and 6B. FIGS. 6A and 6B are partial cross-sectional views taken along the line 6-6 (indicated by dashed line) in FIG. 1. As shown in FIG. 6A, the n-type cladding layer 11 has a five-layer structure in which a carrier confining layer 11a, a first current-spreading layer 11b, a first light-extracting layer 11c, a second current-spreading layer (current spreading sub-layer) 11d, and a second light-extracting layer 11e are sequentially stacked in this order on the surface of the light-emitting layer 12. The terrace structure on the light-extracting surface side corresponds to the portion where the first light-extracting layer 11c, the second current-spreading layer (current spreading sub-layer) 11d, and the second light-extracting layer 11e are stacked.

The second current-spreading layer 11d and the second light-extracting layer 11e are provided only in the protrusions 10c (i.e., upper portion of terrace structure). More specifically, the second current-spreading layer 11d is positioned closer to the ohmic electrodes 52 than a plane defined by top portions of projections that form a light-extracting structure 60 in the recesses 10a, which will be described later. Further, the first light-extracting layer 11c exists in the protrusions 10c and in the regions closer to the reflective surface than the surfaces of the recesses 10a (i.e., regions where no terrace structure is formed). In the configuration described above, the surfaces of the recesses 10a and the protrusions 10c (i.e., bottom surfaces of recesses 10a and top surfaces of protrusions 10c), which form the terrace structure on the light-extracting surface side, are respectively formed on the first light-extracting layer 11c and the second light-extracting layer 11e. Further, the carrier confining layer 11a and the first current-spreading layer 11b are not involved in the formation of the terrace structure.

The carrier confining layer 11a is made, for example, of $Al_{0.5}In_{0.5}P$ and has a thickness of 0.5 μm. The carrier concentration of the carrier confining layer 11a is $1 \times 10^{17}$ cm$^{-3}$. Each of the first current-spreading layer 11b and the second current-spreading layer 11d is made, for example, of $(Al_{0.4}Ga_{0.6})_{0.5}In_{0.5}P$ and has a thickness of 0.25 μm. The carrier concentration of each of the first current-spreading layer 11b and the second current-spreading layer 11d is $1 \times 10^{18}$ cm$^{-3}$. Each of the first light-extracting layer 11c and the second light-extracting layer 11e is made, for example, of $(Al_{0.7}Ga_{0.3})_{0.5}In_{0.5}P$ and has a thickness of 0.7 μm. The carrier concentration in each of the first light-extracting layer 11c and the second light-extracting layer 11e is $3 \times 10^{17}$ cm$^{-3}$.

A light-extracting structure 60 having projections and depressions is formed on the surfaces of the first light-extracting layer 11c and the second light-extracting layer 11e (i.e., the bottom surfaces of the recesses and the top surfaces of the protrusions that form the terrace structure on the light-extracting surface side). No light-extracting structure (or photonic crystal) 60 is provided in the regions where the Schottky electrodes 51, the ohmic electrodes 52, and the connection wiring lines 53 are disposed (see FIG. 2). The light-extracting structure 60 is formed of a plurality of conical projections, which are arranged periodically. The width A (bottom diameter) of each of the projections is 0.5 μm and the height B thereof is 0.6 μm. Forming the thus configured light-extracting structure 60 allows the light-extracting efficiency to be improved.

From the viewpoint of improvement in the light-extracting efficiency, the width A of each of the projections that form the light-extracting structure 60 is desirably set at a value within a range $2.0 \times \lambda_0/n \leq A \leq 5.0 \times \lambda_0/n$ and the height B of each of the projections is desirably set at a value within a range $0.5 \times A \leq B \leq 1.5 \times A$. In the first expression, $\lambda_0$ represents the wavelength of the emitted light in a vacuum, and n represents the refractive index of the semiconductor film for the wavelength of the emitted light. For example, when an AlGaInP-based material is used, $\lambda_0$ is 625 nm and n is 3.3, in which case, the width A ranges from 0.4 to 1.0 μm. The height B of each projection is lower than the height of each protrusion 10c (i.e., the depth Hu of each recess 10a on the light-extracting surface side).

The light-extracting structure 60 is not limited to the configuration described above but may, for example, be formed of randomly arranged projections, and each of the projections may have a cylindrical, polygonal column, or polygonal pyramidal shape.

According to the structure of each of the layers described above, the first current-spreading layer 11b and the second current-spreading layer 11d have resistance lower than that of the first light-extracting layer 11c and the second light-extracting layer 11e. As a result, the first current-spreading layer 11b and the second current-spreading layer 11d can spread the current flowing from the ohmic electrodes 52 to the reflective electrode 22 in the direction (hereinafter also referred to as horizontal direction) perpendicular to the direction in which the semiconductor film 10 has grown (hereinafter also referred to as vertical direction) in contrast with the first light-extracting layer 11c and the second light-extracting layer 11e. Specifically, the current can be spread. More specifically, forming the first current-spreading layer 11b and the second current-spreading layer 11d allows the current flowing from the ohmic electrodes 52 toward the protrusions 10d to be spread. The ability to spread the current makes the light emission distribution in the semiconductor light-emitting device 1 uniform, whereby the light emission efficiency of the semiconductor light-emitting device 1 can be improved. The ability to spread the current further allows the bottom area and the depth of each recess 10a to be increased, whereby the multiple reflection of the light emitted from the light-emitting layer 12 can be suppressed and the light emission efficiency of the semiconductor light-emitting device 1 can be improved accordingly. The resistance of the first current-spreading layer 11b and the second current-spreading layer 11d is desirably 50% of or lower than the resistance of the first light-extracting layer 11c and the second light-extracting layer 11e, more desirably 30% or lower.

Figure 7:
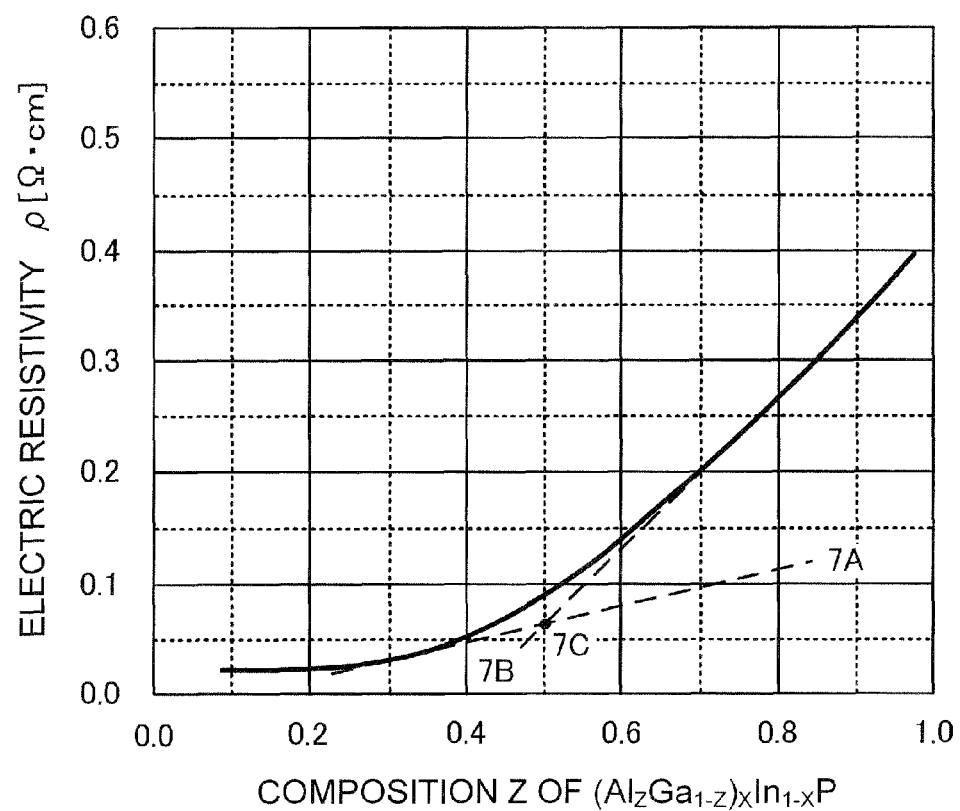
FIG. 7 shows a graph showing change in electric resistivity versus Al composition z in a semiconductor light-emitting device made of an AlGaInP-based material.

Since the first current-spreading layer 11b and the second current-spreading layer 11d only need to have resistance lower than that of the first light-extracting layer 11c and the second light-extracting layer 11e from the viewpoint described above, the first current-spreading layer 11b and the second current-spreading layer 11d can be configured as appropriate under the conditions of an Al composition of 0.5 or lower and a carrier concentration of $1\times10^{18}$ cm$^{-3}$ or higher. The reason why the Al composition is set at 0.5 or lower is described with reference to FIG. 7. FIG. 7 shows a graph illustrating change in electric resistivity versus the Al composition z in a semiconductor light-emitting device made of an AlGaInP-based material (i.e., $(Al_zGa_{1-z})_xIn_{1-x}P$). The horizontal axis represents the Al composition z, and the vertical axis represents electric resistivity $\rho$. In FIG. 7, a tangent 7A (indicated by broken line) is a representative tangent to the curve in a low electric resistivity range (0.1 or lower), a tangent 7B (indicated also by broken line) is a representative tangent to the curve in a high electric resistivity range (0.1 or higher), and an intersection 7C is where the tangent 7A intersects the tangent 7B. At the intersection 7C, the Al composition z is 0.5 and the electric resistivity $\rho$ is 0.06. As seen from the curve shown in FIG. 7, the electric resistivity $\rho$ increases with the Al composition z, but beyond the intersection 7C, the electric resistivity increases steeply as the Al composition z is gradually increased. In view of this fact, keeping the Al composition z at the value at the intersection 7C (i.e., 0.5) or lower prevents the electric resistivity $\rho$ from varying greatly but allows it to be kept at a sufficiently small value even when the Al composition z varies.

It is desirable to maximize the thicknesses of the first current-spreading layer 11b and the second current-spreading layer 11d if the priority is given to the spread of the current, but larger thicknesses of the first current-spreading layer 11b and the second current-spreading layer 11d result in an increase in light absorption therein. The thicknesses of the first current-spreading layer 11b and the second current-spreading layer 11d are therefore desirably set to be smaller than or equal to 1.0 μm (more preferably 0.5 μm).

Further, the first light-extracting layer 11c and the second light-extracting layer 11e have lower light absorptance than the first current-spreading layer 11b and the second current-spreading layer 11d. The amount of light absorption in the semiconductor film 10 can therefore be smaller than in a case where the n-type cladding layer 11 is formed only of the current-spreading layers described above, whereby the light emission efficiency of the semiconductor light-emitting device 1 can be improved. It is conceivable to configure the n-type cladding layer 11 only with the light-extracting layers, but in which case, the n-type cladding layer 11 needs to be thicker for uniform current spreading. In this case, the optical path length of the light propagating through the n-type cladding layer 11 increases, and the light emission efficiency of the semiconductor light-emitting device 1 decreases accordingly. The current-spreading layers described above are therefore required.

Since the light absorption in the first light-extracting layer 11c and the second light-extracting layer 11e only need to be lower than that in the first current-spreading layer 11b and the second current-spreading layer 11d from the viewpoint described above, the first light-extracting layer 11c and the second light-extracting layer 11e can be configured as appropriate under the conditions of an Al composition z within $0.7 \leq z \leq 1.0$ and a carrier concentration of $1\times10^{18}$ cm$^{-3}$ or lower. When the In composition of $(Al_zGa_{1-z})_xIn_{1-x}P$ is 0.5 (that is, lattice-matched to the GaAs growth substrate) and the Al composition (z) of $(Al_zGa_{1-z})_xIn_{1-x}P$ is 0.7 or higher, the first light-extracting layer 11c and the second light-extracting layer 11e become within indirect transition regions, which absorb far less light than a layer whose Al composition is 0.7 or lower, whereby the self-absorption of light in the first light-extracting layer 11c and the second light-extracting layer 11e can be suppressed. Even when the In composition of the AlGaInP is not 0.5, the advantageous effect described above can be provided if the Al composition of the AlGaInP can be adjusted so that the first light-extracting layer 11c and the second light-extracting layer 11e become within indirect transition regions. Further, the reason why the carrier concentration is set at a value lower than or equal to $1\times10^{18}$ cm$^{-3}$ is that free electrons greatly absorb light when the carrier concentration is higher than $1\times10^{18}$ cm$^{-3}$. Moreover, although the thicknesses of the first light-extracting layer 11c and the second light-extracting layer 11e are desirably minimized if the priority is given to suppression of light absorption, considering that the light-extracting structure 60 described above is formed on the surfaces of the first light-extracting layer 11c and the second light-extracting layer 11e, the thicknesses of the first light-extracting layer 11c and the second light-extracting layer 11e are preferably greater than the height B of the projections that form the light-extracting structure 60 but smaller than or equal to twice the height of the projections.

Since the first light-extracting layer 11c and the second light-extracting layer 11e have greater Al compositions than the first current-spreading layer 11b and the second current-spreading layer 11d, the first light-extracting layer 11c and the second light-extracting layer 11e have greater carrier mobility than the first current-spreading layer 11b and the second current-spreading layer 11d. As a result, even when the carrier concentration of the first light-extracting layer 11c and the second light-extracting layer 11e is equal to that of the first current-spreading layer 11b and the second current-spreading layer 11d, the resistance of the first current-spreading layer 11b and the second current-spreading layer 11d can be reduced.

Further, since the light-extracting structure 60 is formed of a plurality of projections, the projections block horizontal current spreading over the surfaces of the first light-extracting layer 11c and the second light-extracting layer 11e, where the projections are formed. In view of this fact, the first light-extracting layer 11c and the second light-extracting layer 11e, which do not relatively contribute to the spread of the current, are provided to the bottom surfaces of the recesses 10a and the top surfaces of the protrusions 10c, where the light-extracting structure 60 is formed.

In the n-type cladding layer 11 described above, the second current-spreading layer 11d is provided in each protrusion 10c and the first current-spreading layer 11b is provided below the first light-extracting layer 11c. As a comparative example there shall now be described a configuration in which only a third current-spreading layer 11f is provided below the first light-extracting layer 11c as shown in FIG. 6B. In this case, the third current-spreading layer 11f has a thickness equal to the sum of the thickness of the first current-spreading layer 11b and the thickness of the second current-spreading layer 11d. The reason for this is to produce the same current spreading as that in the case where the two current-spreading layers described above are provided. In the structure of the n-type cladding layer 11 shown in FIG. 6B, however, the light to be emitted through the recesses 10a out of the semiconductor light-emitting device 1 propagates through the third current-spreading layer 11f having a thickness twice the thickness of the first current-spreading layer 11b in FIG. 6A, and hence the amount of light absorption is greater than that in the structure shown in FIG. 6A. In this case, the light emission efficiency of the semiconductor light-emitting device disadvantageously decreases as compared with that of the semiconductor light-emitting device having the structure shown in FIG. 6A.

In the embodiment described above, the contour of each recess 10a on the light-extracting surface side coincides with the contour of the corresponding protrusion 10d on the reflective surface side, and the contour of each protrusion 10c on the light-extracting surface side coincides with the contour of the corresponding recess 10b on the reflective surface side (the recesses 10a do not coincide with the recesses 10b and the protrusions 10c do not coincide with the protrusions 10d) in the thickness direction of the semiconductor film 10, but they are not necessarily limited to this configuration. Specifically, the recesses 10a on the light-extracting surface side may or may not coincide with the recesses 10b on the reflective surface side, and the protrusions 10c on the light-extracting surface side may or may not coincide with the protrusions 10d on the reflective surface side in the thickness direction of the semiconductor film 10. Further, the recesses 10a are provided on the light-extracting surface side and the recesses 10b are provided on the reflective surface side in the embodiment described above, but only the recesses 10a may be provided on the light-extracting surface side. Moreover, the p side of the semiconductor film 10 is the reflective surface and the n side thereof is the light-extracting surface in the embodiment described above, but the n side may be the reflective surface and the p side may be the light-extracting surface. Further, the counter electrode is provided in the embodiment described above, but the reflection electrode 22 may be formed over the entire surface of the bonding film 30 so that the reflection electrode 22 covers the bonding film 30.

A description will next be made of a method for manufacturing the semiconductor light-emitting device 1 according to the first embodiment of the invention. In the method for manufacturing a semiconductor light-emitting device in the following description, terrace structures are provided on opposite sides of the semiconductor film, and a light-extracting structure is provided on the surface of the semiconductor film on the light-extracting surface side.

[Step of Forming Semiconductor Film]

The semiconductor film 10 is first formed in an organic metal vapor deposition (MOCVD) process. As a growth substrate 61 used for crystal growth of the semiconductor film 10, an n-type GaAs substrate cut along the direction inclined from the (100) plane toward the [011] direction by 15° and having a thickness of 300 μm is used. In a specific growth step, the following layers are sequentially stacked on the growth substrate 61: the second light-extracting layer 11e made of $(Al_{0.7}Ga_{0.3})_{0.5}In_{0.5}P$ and having a thickness of 0.7 μm, the second current-spreading layer 11d made of $(Al_{0.4}Ga_{0.6})_{0.5}In_{0.5}P$ and having a thickness of 0.25 μm, the first light-extracting layer 11c made of $(Al_{0.7}Ga_{0.3})_{0.5}In_{0.5}P$ and having a thickness of 0.7 μm, the first current-spreading layer 11b made of $(Al_{0.4}Ga_{0.6})_{0.5}In_{0.5}P$ and having a thickness of 0.25 μm, and the carrier confining layer 11a made of $Al_{0.5}In_{0.5}P$ and having a thickness of 0.5 μm. The n-type cladding layer 11 is thus formed. In the formation of the n-type cladding layer 11, a raw-material gas that will form carriers is supplied and the amount thereof is adjusted as appropriate so that the carrier concentration of the carrier confining layer 11a is $1 \times 10^{17}$ cm$^{-3}$, the carrier concentration of the first current-spreading layer 11b and the second current-spreading layer 11d is $1 \times 10^{18}$ cm$^{-3}$, and the carrier concentration of the first light-extracting layer 11c and the second light-extracting layer 11e is $3 \times 10^{17}$ cm$^{-3}$.

The light-emitting layer 12 is next formed on the n-type cladding layer 11. The light-emitting layer 12 has a multi-quantum-well structure in which a well layer made of $(Al_{0.1}Ga_{0.9})_{0.5}In_{0.5}P$ and having a thickness of 20 nm and a barrier layer made of $(Al_{0.56}Ga_{0.44})_{0.5}In_{0.5}P$ and having a thickness of 10 nm are alternately stacked 15 times. The Al composition of the well layer can be adjusted within a range $0 \leq z \leq 0.4$ in accordance with the wavelength of the emitted light.

The p-type cladding layer 13 made of $(Al_{0.7}Ga_{0.3})_{0.5}In_{0.5}P$ and having a thickness of 1 μm is then formed on the light-emitting layer 12. The Al composition z of the n-type cladding layer 11 and the p-type cladding layer 13 can be adjusted within a range $0.4 \leq z \leq 1.0$.

Figure 8A:
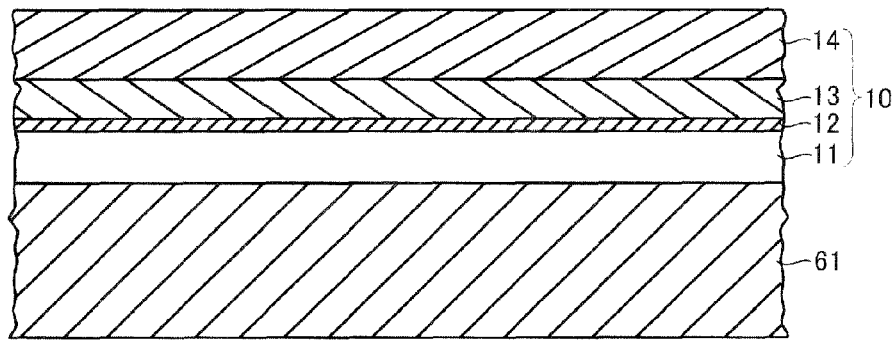
FIGS. 8A to 8C are cross-sectional views showing a method for manufacturing the semiconductor light-emitting device according to the first embodiment of the invention.
Figure 8B:
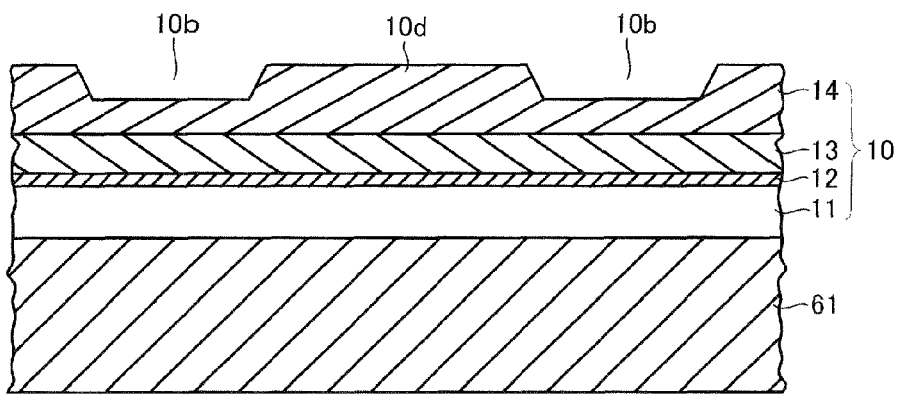

The p-type contact layer 14 made of $Ga_{0.9}In_{0.1}P$ and having a thickness of 1.5 μm is then formed on the p-type cladding layer 13. The In composition of the p-type contact layer 14 can be adjusted to the extent that the light from the light-emitting layer 12 is not absorbed. The layers described above form the semiconductor film 10 having a thickness of 5.6 μm (FIG. 8A).

Phosphine (PH$_3$) is used as the V-group raw material, and organic metals are used as the III-group raw material, specifically, trimethylgallium (TMGa), trimethylaluminum (TMAl), and trimethylindium (TMI). Silane (SiH$_4$) is used as a raw material for Si, which is an n-type impurity, and dimethylzinc (DMZn) is used as a raw material for Zn, which is a p-type impurity. The growth temperature is set at a value between 750 and 850° C. Hydrogen is used as a carrier gas. The growth pressure is set at 10 kPa.

[Step of Forming Terrace Structure on Reflective Surface Side]

The terrace structure is formed on the reflective surface side of the semiconductor film 10 by processing the p-type contact layer 14, which is disposed on the reflective surface side. A mask made of SiO$_2$ is formed on the p-type contact layer 14, and the portions of the p-type contact layer 14 that are exposed through openings in the mask are removed in a dry etching process to form the recesses 10b. The recesses 10b and the protrusions 10d are thus formed at the same time. In this process, the recesses 10b are formed to a depth of 1.5 µm by controlling the etching time. The reason for this is that the depth of the recesses 10b should be 60% of the thickness of the p-type semiconductor layer including the p-type contact layer 14 and the p-type cladding layer 13 and 25% of the overall thickness of the semiconductor film 10. Further, the ratio of the recesses 10b to the entire surface of the semiconductor film 10 on the reflective surface side is set at 30% (with respect to area; see FIG. 8B). It is noted that the etching is so performed that the bottom surfaces of the recesses 10b may reach the p-type cladding layer 13 but do not reach the light-emitting layer 12. The etching can alternatively be wet etching.

[Steps of Forming Reflective Film and Metal Layer]

An $SiO_2$ film that forms the dielectric film 21 is formed on the p-type contact layer 14 in a plasma CVD process in such a way that the surfaces of the recesses 10b and the protrusions 10d are covered. The thickness t of the $SiO_2$ film is so set that $t=m\times\lambda_0/(4n)$ is satisfied, where $\lambda_0$ represents the wavelength of the emitted light in a vacuum, "n" represents the refractive index of the $SiO_2$ film, and "m" is an arbitrary integer. In this example, the above values are set as follows: $\lambda_0=625$ nm, n=1.45, and m=3, and the thickness "t" of the dielectric film 21 is calculated to be 320 nm. Subsequently, a resist mask is formed on the $SiO_2$ film, and then the $SiO_2$ film is patterned by performing etching using buffered hydrofluoric acid (BHF) in accordance with the pattern of the reflection electrode. The portions where the $SiO_2$ film is removed form openings, through which the p-type contact layer 14 is exposed. The $SiO_2$ film can alternatively be formed by using plasma CVD, thermal CVD, or sputtering. Further, the $SiO_2$ film can alternatively be etched in a dry etching process. The dielectric film 21 is not necessarily made of $SiO_2$ but can alternatively be made of $Si_3N_4$, $Al_2O_3$, or any other suitable transparent dielectric material.

The reflection electrode 22 made of AuZn and having a thickness of 300 nm is then formed on the dielectric film 21 by using resistive heating evaporation, EB evaporation, sputtering, or any other suitable known film forming technique. The reflection electrode 22 is in contact with the p-type contact layer 14 through the openings formed in the dielectric film 21 in the etching process described above. The dielectric film 21 divides the reflection electrode 22 into the line electrodes 22a and the dot electrodes 22b. The reflective film 20 formed of the dielectric film 21 and the reflection electrode 22 is thus formed by carrying out the steps described above.

The barrier metal layer is next formed by sequentially depositing TaN (thickness: 100 nm), TiW (100 nm), and TaN (100 nm) on the reflective film 20 in a sputtering process. The barrier metal layer may alternatively be formed of a single layer or two or more layers containing Ta, Ti, W, and other suitable refractory metals or nitrides thereof. The barrier metal layer is not necessarily formed in a sputtering process but can be formed in an EB evaporation process. Thereafter, the resultant structure undergoes heat treatment in a nitrogen atmosphere at about 500° C. In this process, satisfactory ohmic contact is formed between the reflection electrode 22 and the p-type contact layer 14.

Figure 8C:
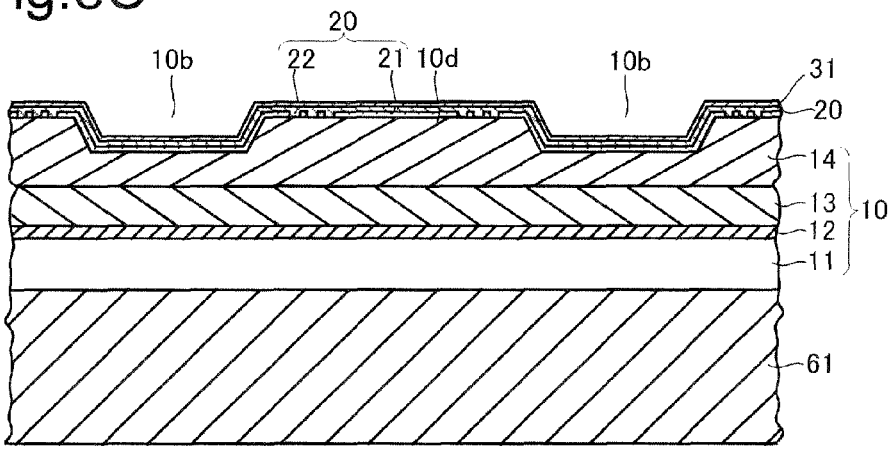

Thereafter, Ni (300 nm) and Au (30 nm) are sequentially deposited on the barrier metal layer by using resistive heating evaporation, sputtering, EB evaporation, or any other suitable film forming technique. The eutectic solder layer is thus formed. The formation of the first bonding layer 31 formed of the barrier metal layer and the eutectic solder layer is thus completed (FIG. 8C).

[Step of Bonding Support Substrate]

The support body (simply referred to as support) 40, which supports the semiconductor film 10, is then formed. Specifically, a Si substrate that is imparted with conductivity by adding a p-type impurity is prepared as the support substrate 41, and the ohmic metal layers 42 and 43 made of Pt and having a thickness of 200 nm are formed on opposite sides of the support substrate 41 by EB evaporation. The support formed of the support substrate 41 and the ohmic metal layers 42 and 43 is thus formed. The ohmic metal layers 42 and 43 are not necessarily made of Pt but can be made of, e.g., Au, Ni, Ti, or any other material that can form ohmic contact with the Si substrate. The support substrate 41 may alternatively be made of, e.g., Ge, Al, Cu, or any other suitable material having electric conductivity and high heat conductivity.

The second bonding layer 32 is then formed by sequentially depositing Ti (150 nm), Ni (100 nm), and AuSn (600 nm) on the ohmic metal layer 43 in a sputtering process. The AuSn layer serves as a eutectic bonding material and is desirably composed of 70 to 80 wt % of Au and 20 to 30 wt % of Sn. The Ni layer functions to improve wettability to the eutectic bonding material. Ni can be replaced with NiV or Pt. The Ti layer functions to improve adherence between the Ni and the ohmic metal layer 43.

Figure 9A:
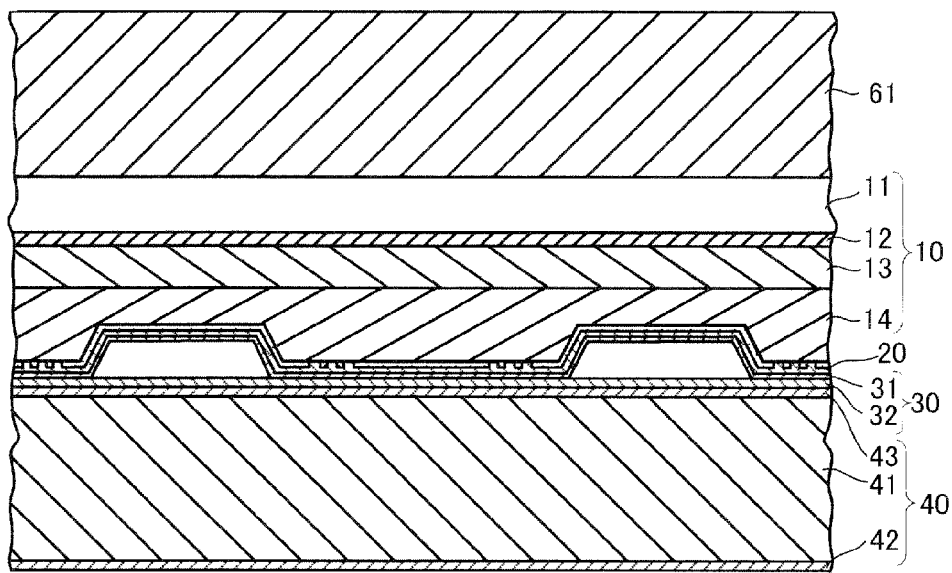
FIGS. 9A and 9B are cross-sectional views showing the method for manufacturing the semiconductor light-emitting device according to the first embodiment of the invention.

The semiconductor film 10 is then bonded to the supports 40 in a thermo-compression process. The first bonding layer 31 on the semiconductor film 10 and the second bonding layer 32 on the support 40 are so held that they come into intimate contact with each other in a nitrogen atmosphere at 1 MPa and 330° C. for 10 minutes. The eutectic bonding material (AuSn) contained in the second bonding layer 32 on the support 40 melts, and the molten AuSn and the eutectic solder layer (Ni/Au) on the semiconductor film 10 form AuSnNi. The support 40 is thus bonded to the semiconductor film 10 (FIG. 9A). Specifically, the bonding film 30 formed of the first bonding layer 31 and the second bonding layer 32 is formed in the thermo-compression process.

[Step of Removing Growth Substrate]

Figure 9B:
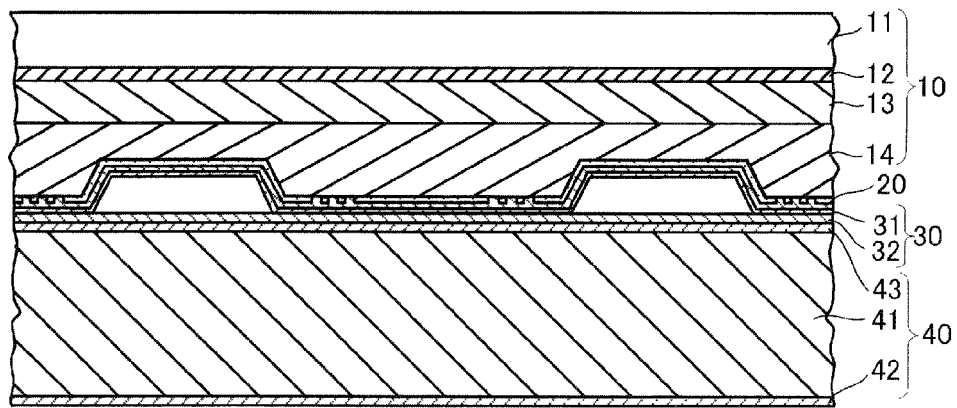

The growth substrate 61 used for the crystal growth of the semiconductor film 10 is removed in a wet etching process using a mixture liquid of aqueous ammonia and aqueous hydrogen peroxide. The growth substrate 61 may alternatively be removed by using dry etching, mechanical polishing, or chemical-mechanical polishing (CMP) (FIG. 9B).

[Step of Forming Terrace Structure on Light-Extracting Surface Side]

Figure 10A:
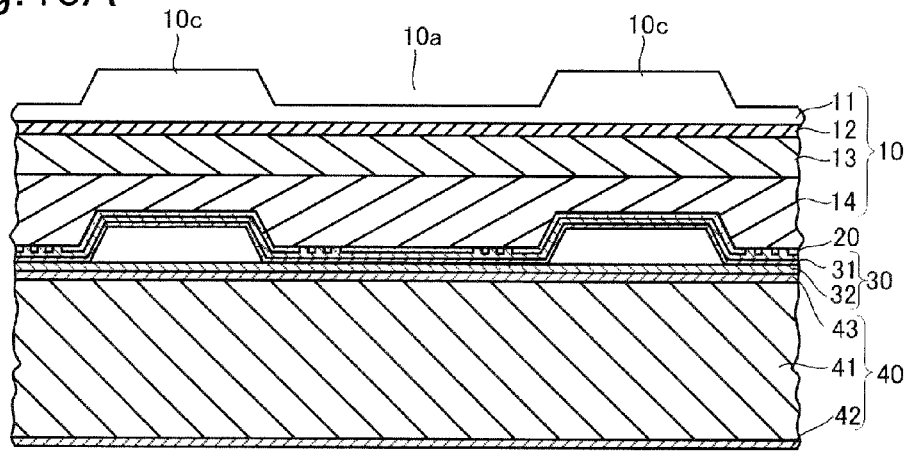
FIGS. 10A to 10C are cross-sectional views showing the method for manufacturing the semiconductor light-emitting device according to the first embodiment of the invention.

The terrace structure is then formed on the light-extracting surface side of the semiconductor film 10 by processing the n-type cladding layer 11 exposed by removing the growth substrate 61. Specifically, a mask made of $SiO_2$ and having desired openings is formed on the n-type cladding layer 11, the portions of the n-type cladding layer 11 that are exposed through the openings in the mask are removed in a dry etching process, and the recesses 10a on the light-extracting surface side are formed. The recesses 10a and the protrusions 10c on the light-extracting surface side are thus formed at the same time. The recesses 10a are formed to a depth of 1.0 µm by controlling the etching period. The thus controlled depth of the recesses 10a corresponds to 50% of the thickness of the n-type cladding layer 11 and 25% of the overall thickness of the semiconductor film 10. The ratio of the recesses 10a to the entire surface of the semiconductor film 10 on the light-extracting surface side is set at 70% (with respect to area; see FIG. 10A). The desired regions of the n-type cladding layer 11 are not necessarily removed in a dry etching process but may alternatively be removed in a wet etching process.

[Step of Forming Light-Extracting Structure]

Figure 10B:
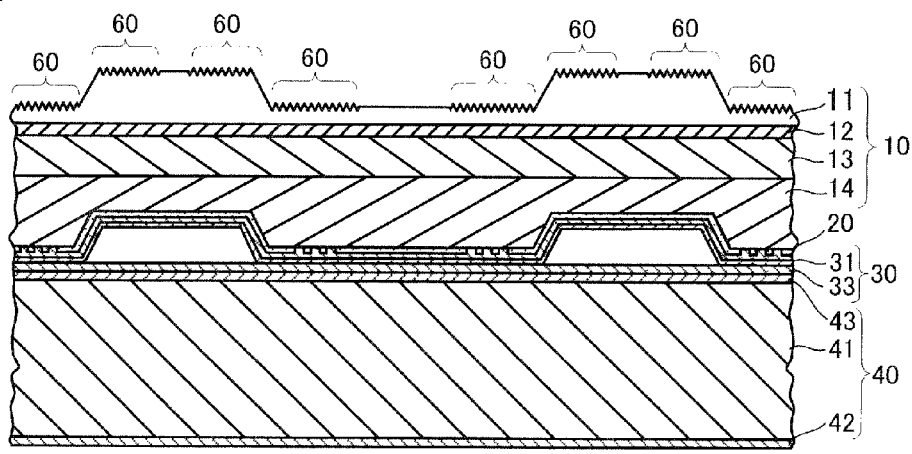

The light-extracting structure 60 for improving the light-extracting efficiency is then formed by processing the surface of the n-type cladding layer 11 to form microscopic structures. Specifically, a mask having an artificial periodic structure is formed on the n-type cladding layer 11 in photolithography and lift-off processes, and then a plurality of conical projections are formed on the surface of the n-type cladding layer 11 in a dry etching process. The conical projections are arranged in a triangular grid pattern at a cycle of 300 to 1000 nm (500 nm, for example) and having a height of 600 nm and an aspect ratio ranging from 0.7 to 1.5 (1.2, for example). The light-extracting structure 60 is thus formed (FIG. 10B). The mask pattern can alternatively be formed by using EB lithography, nano-imprinting, or any other microscopically processing technique. Further, each of the projections that form the light-extracting structure 60 does not necessarily have a conical shape but may alternatively have a cylindrical or pyramidal shape. Moreover, the light-extracting structure 60 may alternatively be formed of a plurality of holes or grooves. Further, the light-extracting structure may alternatively be formed by roughening the surface of the n-type cladding layer 11 in a wet etching process. Further, the processes described above may be performed after a mask is provided as appropriate on the electrode forming regions on the light-extracting surface side. Further, the light-extracting structure may alternatively be provided on inclined surfaces of the protrusions 10c.

[Step of Forming Electrodes on Light-Extracting Surface Side]

Figure 10C:
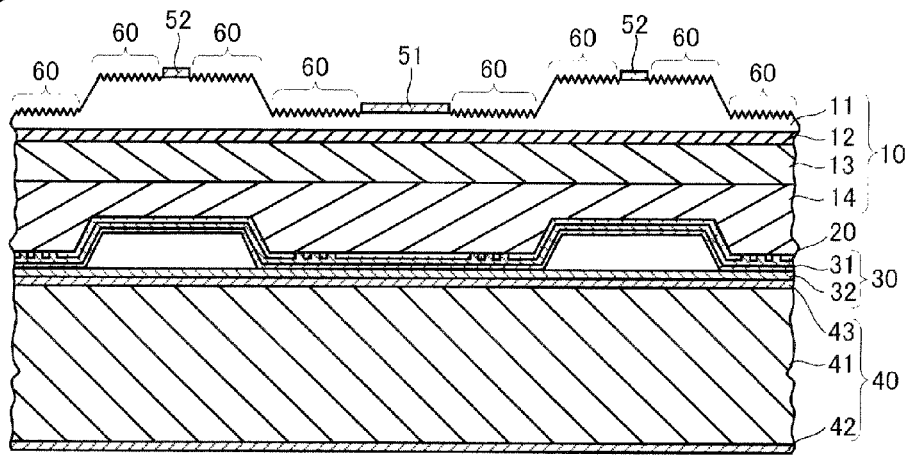

The ohmic electrodes 52, the Schottky electrodes 51, and the connection wiring lines 53 are then formed on the n-type cladding layer 11. Specifically, AuGeNi, which forms ohmic contact with the n-type cladding layer 11, is deposited on the n-type cladding layer 11 in an EB evaporation process, and then the deposited AuGeNi is patterned in a lift-off process to form the ohmic electrodes 52. Subsequently, Ti (100 nm), which forms Schottky contact with the n-type cladding layer 11, is deposited on the n-type cladding layer 11 in an EB evaporation process, and then Au (1.5 µm) is further deposited on the Ti. Thereafter, the deposited Au and Ti are patterned in a lift-off process to form the Schottky electrodes 51 and the connection wiring lines 53. The ohmic electrodes 52 may alternatively be made of AuGe, AuSn, AuSnNi, or any other suitable compound. The Schottky electrodes 51 may alternatively be made of Ta, W, an alloy thereof, or a nitride thereof. Heat treatment is then performed in a nitrogen atmosphere at 400° C. to encourage formation of ohmic contact between the n-type cladding layer 11 and the ohmic electrodes 52 (FIG. 10C).

The semiconductor light-emitting device 1 is thus completed by carrying out the steps described above.

As described above, in the semiconductor light-emitting device 1 according to the first embodiment of the invention, the layers formed in the lower and upper surfaces of the terrace structure on the light-extracting surface side that do not contribute to current spreading are formed of the first light-extracting layer 11c and the second light-extracting layer 11e having low light absorptance, and first current-spreading layer 11b and the second current-spreading layer 11d are formed under the first light-extracting layer 11c and the second light-extracting layer 11e, respectively. In this way, the light emission distribution can be made uniform by the spread of current, and the light-extracting efficiency can be improved at the same time.

Further, since the light-extracting structure 60 formed on the surfaces on the light-extracting surface side is formed of conical or cylindrical projections separated from each other, the regions having been processed to form the light-extracting structure 60 do not contribute to the spread of the current. In the semiconductor light-emitting device 1 according to the first embodiment of the invention, the layers related to the light-extracting structure 60 can therefore be the first light-extracting layer 11c and the second light-extracting layer 11e having low light absorptance (i.e., having high resistance), whereby the amount of absorption in the light-extracting structure 60 can be reduced and the light emission efficiency of the semiconductor light-emitting device 1 can be improved.

Further, in the semiconductor light-emitting device 1 according to the first embodiment of the invention, since the first current-spreading layer 11b and the second current-spreading layer 11d are provided in the upper and lower portions of the terrace structure, respectively, to compensate for current spreading hampered by the formation of the light-extracting structure 60 and the terrace structure, the distribution of the light emitted in the semiconductor light-emitting device can be made uniform.

Second Embodiment

In the first embodiment of the invention, a semiconductor light-emitting device made of an AlGaInP-based material has been described. Alternatively, a semiconductor light-emitting device according to the invention may be made of a GaN-based material. A semiconductor light-emitting device made of a GaN-based material will be described with reference to FIGS. 11 to 13.

Figure 11A:
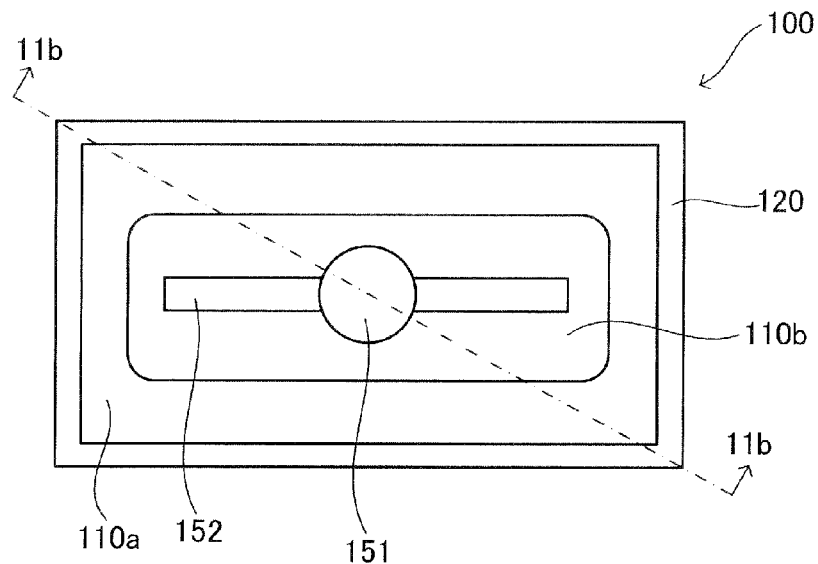
FIG. 11A is a plan view of a semiconductor light-emitting device according to a second embodiment of the invention.
Figure 11B:
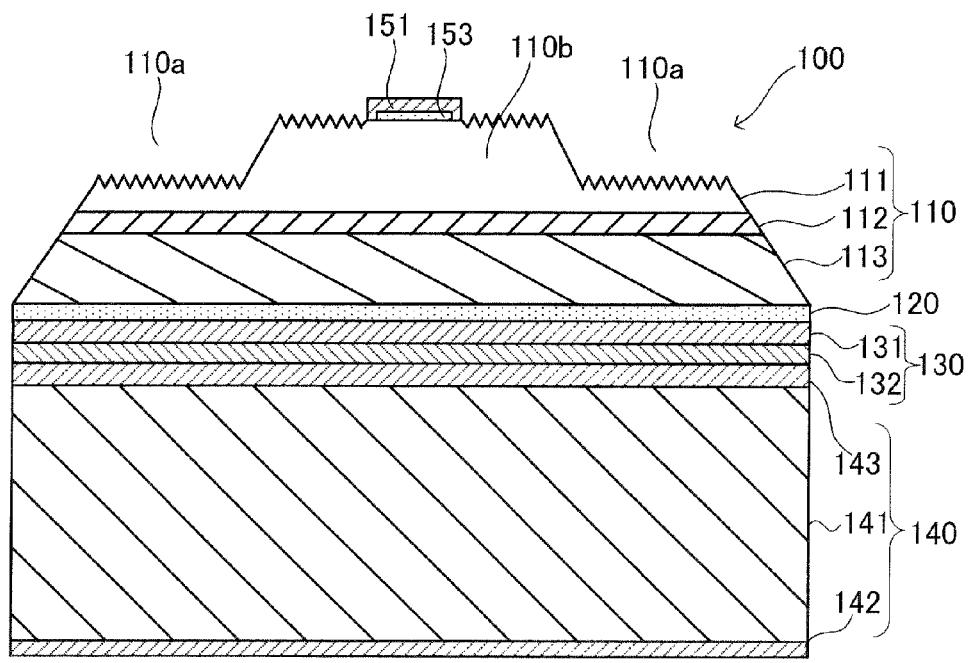
FIG. 11B is a cross-sectional view taken along the line 11$b$-11$b$ (indicated by the dashed line) in FIG. 11A.
Figure 12:
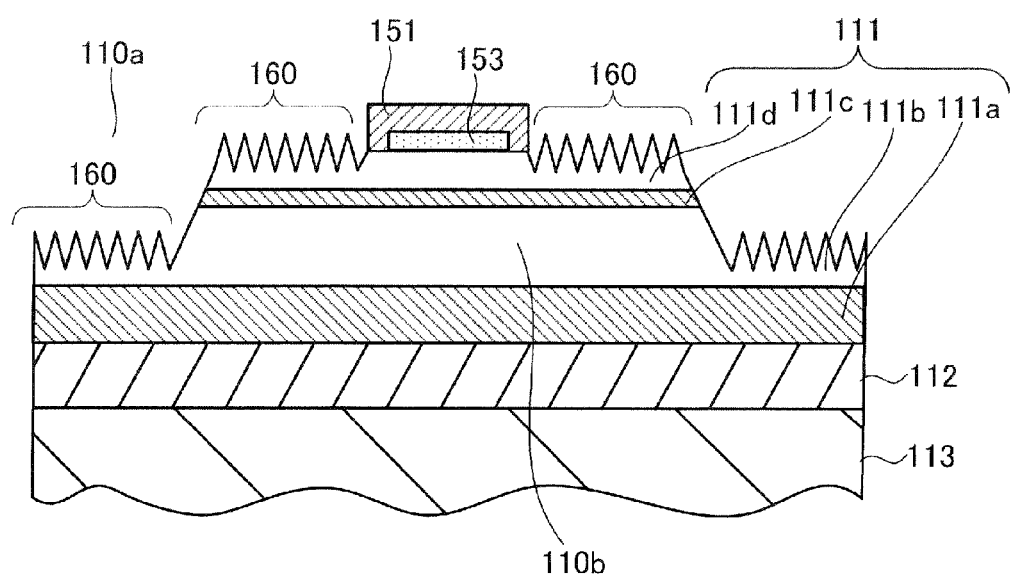
FIG. 12 is a cross-sectional view showing the structure of an n-type cladding layer according to the second embodiment of the invention.
Figure 13A:
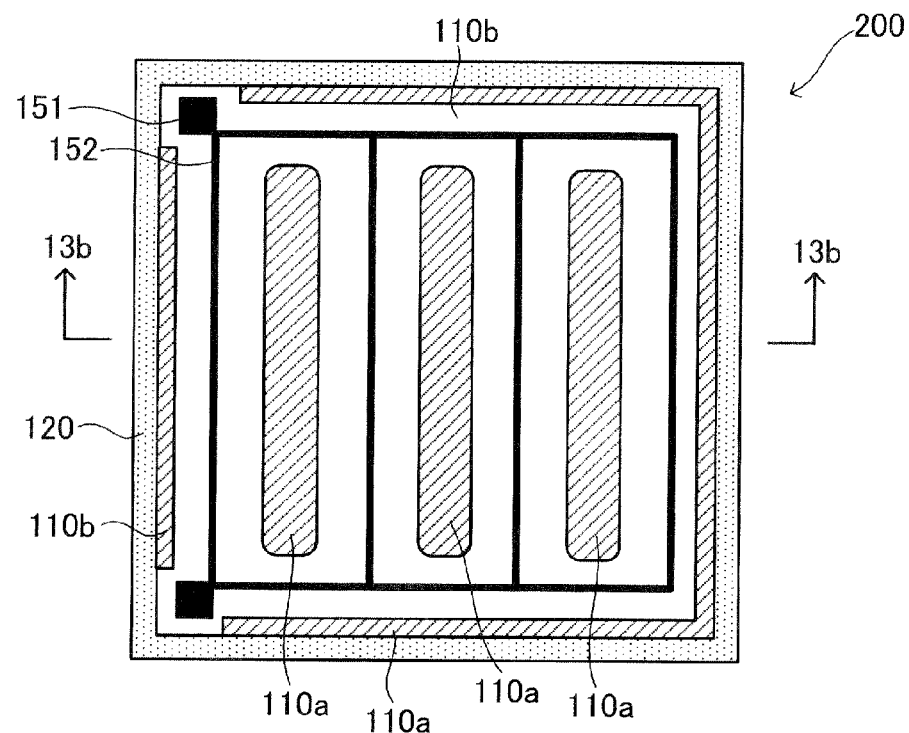
FIG. 13A is a plan view of another semiconductor light-emitting device according to the second embodiment of the invention.
Figure 13B:
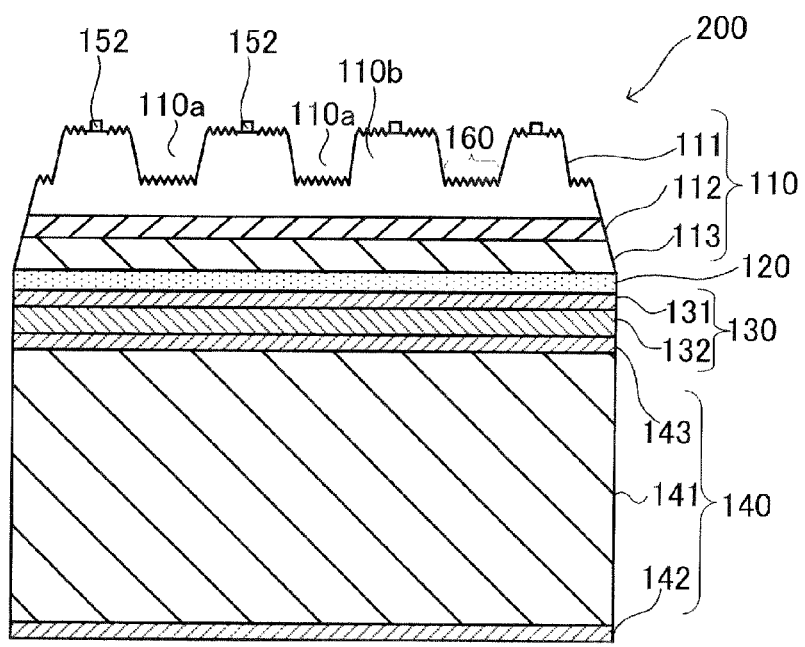
FIG. 13B is a cross-sectional view taken along the line 13$b$-13$b$ in FIG. 13A.

FIG. 11A is a plan view of a semiconductor light-emitting device 100 according to a second embodiment of the invention, and FIG. 11B is a cross-sectional view taken along the line 11b-11b (indicated by dashed line) in FIG. 11A. FIG. 12 is an enlarged cross-sectional view for describing the structure of an n-type cladding layer in the semiconductor light-emitting device 100 according to the second embodiment of the invention. FIG. 13A is a plan view of a semiconductor light-emitting device 200 having a different configuration of the surface electrodes and the terrace structure in FIGS. 11A and 11B, and FIG. 13B is a cross-sectional view taken along the line 13b-13b in FIG. 13A.

The semiconductor light-emitting device 100 includes a semiconductor film 110, a reflection electrode 120, a bonding film 130, a support 140, Schottky electrodes (bonding pads) 151, ohmic electrodes 152, and insulating films 153, as shown in FIGS. 11A and 11B. The semiconductor light-emitting device 100 has what is so called a bonded structure in which the semiconductor film 110 is bonded to the support 140 with the reflection electrode 120 and the bonding film 130 therebetween.

The semiconductor film 110 has a structure in which an n-type cladding layer 111, a light-emitting layer 112, and a p-type cladding layer 113 are sequentially stacked in the stated order from the side where a light-extracting surface is present. The overall thickness of the semiconductor film 110 is, for example, 5.15 µm, and the external shape of a principal plane of the semiconductor film 110 is, for example, a square each side of which is 300 µm in length. The thickness of the n-type cladding layer 111 is about 5 µm and the structure thereof will be described later. The light-emitting layer 112 has a multi-quantum-well structure in which a well layer made of $In_{0.35}Ga_{0.65}N$ and having a thickness of about 2.2 nm and a barrier layer made of GaN and having a thickness of about 14 nm are alternately stacked repeatedly 5 times. The p-type cladding layer 13 has a structure in which a layer made of $Al_{0.2}Ga_{0.8}N$ and having a thickness of about 40 nm and a layer made of GaN and having a thickness of about 150 nm are stacked. A strain buffering layer in which a layer made of GaN and having a thickness of about 2 nm and a layer made of $In_{0.2}Ga_{0.8}N$ and having a thickness of about 2 nm are alternately stacked repeatedly 30 times may be provided between the n-type cladding layer 111 and the light-emitting layer 112.

The semiconductor film 110 has recesses 110a and protrusions 110b formed by partially removing superficial or surface regions of the semiconductor film 110 on the light-extracting surface side (the n-type cladding layer 111 side). Specifically, the semiconductor film 110 has what is called a terrace structure. The recesses 10a on the light-extracting surface side are recessed toward the reflective surface. The recesses 10a are so formed that they do not reach the light-emitting layer 112.

The reflective electrode 120 is provided to cover the surface of the p-type cladding layer 113. The reflective electrode 120 is made, for example, of Ag. The reflective electrode 22 is in contact with the semiconductor film 110, and ohmic contact is formed between the reflective electrode 22 and the semiconductor film 110. The reflective electrode 120 forms a reflective surface that extends along the interface between the reflective electrode 120 and the semiconductor film 110 and reflects light emitted from the light-emitting layer 112 toward the light-extracting surface. In the second embodiment of the invention, no counter electrode is formed, and the reflective electrode 120 is formed to cover the entire surface of the p-type cladding layer 113, unlike the first embodiment of the invention. The reflective electrode 120 is not necessarily made of Ag but can alternatively be made of any material having high optical reflectance and capable of forming ohmic contact with the p-type contact layer 113.

A first bonding layer 131 formed of a barrier metal layer and a eutectic solder layer is provided on the reflective electrode 120. A second bonding layer 132 is so provided that part thereof is in contact with the first bonding layer 131. The first bonding layer 131 and the second bonding layer 132 form the bonding film 130. The barrier metal layer can, for example, be formed of a single layer or two or more layers containing Ta, Ti, W, and other refractory metals or nitrides thereof. The barrier metal layer prevents Ag contained in the reflective electrode 120 from diffusing out therefrom and prevents a eutectic bonding material (AuSn, for example) contained in the second bonding layer 132 from diffusing into the reflective electrode 120. The eutectic solder layer contains, for example, Ni and Au, which serve to improve wettability with the eutectic bonding material contained in the second bonding layer 132 when the first bonding layer 131 is boned to the second bonding layer 132. The support 140 can therefore be bonded to the semiconductor film 110 in a satisfactory manner. The second bonding layer 132 is a metal layer containing Ti, Ni, AuSn, and other substances.

The Schottky electrodes 151 and the ohmic electrodes 152, which form the surface electrodes, are formed on the n-type cladding layer 111, which serves as the light-extracting surface. More specifically, the Schottky electrodes 151 are formed on the n-type cladding layer 111 via the insulating films 153, whereas the ohmic electrodes 152 are formed directly on the surface of the n-type cladding layer 111. The Schottky electrodes 151 form bonding pads and can be made of a material that can form Schottky contact with the n-type cladding layer 111, for example, Ta, Ti, W, or an alloy thereof. The Schottky electrodes 151 are not necessarily made of a metal material but can be made of $SiO_2$ or any other suitable insulating dielectric. Further, an Au layer may be formed on the outermost surface of each of the Schottky electrodes 151 to improve wire bonding and conductive characteristics. Each of the Schottky electrodes 151 is formed at the center of the surface of the region where the corresponding protrusion 110b of the semiconductor film 110, which has a terrace structure, is formed. The ohmic electrodes 152 are made of a material that can form ohmic contact with the n-type cladding layer 111 and have, for example, a Ti/Pt/Au stacked structure. Further, the ohmic electrodes 152 are formed on the surfaces of the protrusions 110b of the semiconductor film 110. Since the Schottky electrodes 151 are formed on the n-type cladding layer 111 via the insulating films 153 and form Schottky contact with the n-type cladding layer 111, no current flows through the portions of the semiconductor film 110 that are immediately below the Schottky electrodes 151.

The support 140 is formed of a support substrate 141 and ohmic metal layers 142 and 143 formed on the opposite surfaces of the support substrate 141. The support substrate 141 is an Si substrate that is imparted with conductivity, for example, by adding a p-type impurity in high concentration. The ohmic metal layers 142 and 143 are made, for example, of Pt. The second bonding layer 132 is disposed on the ohmic metal layer 143. The support substrate 141 is not necessarily made of Si but can be made of Ge, Al, Cu, or any other suitable conductive material.

The structure of the n-type cladding layer 111 will next be described in detail with reference to FIG. 12. As shown in FIG. 12, the n-type cladding layer 111 has a four-layer structure in which a first current-spreading layer 111a, a first light-extracting layer 111b, a second current-spreading layer 111c, and a second light-extracting layer 111d are sequentially stacked in the stated order on the surface of the light-emitting layer 112. The second current-spreading layer 111c and the second light-extracting layer 111d are provided only in each protrusion 110b (i.e., upper portion of terrace structure). On the other hand, the first light-extracting layer 111b is formed in the protrusions 110b and the region where no terrace structure is formed, and the first current-spreading layer 111a is formed only in the region where no terrace structure is formed. Specifically, the first current-spreading layer 111a and the first light-extracting layer 111b are disposed in a lower portion of the terrace structure. The first current-spreading layer 111a is made of GaN and has a thickness of 2 μm. The carrier concentration of the first current-spreading layer 111a is $5 \times 10^{18}$ cm$^{-3}$. The second current-spreading layer 111c is made of GaN and has a thickness of 1 μm. The carrier concentration of the second current-spreading layer 111c is $5 \times 10^{18}$ cm$^{-3}$ or higher. Each of the first light-extracting layer 111b and the second light-extracting layer 111d is made of GaN and has a thickness of 1 μm. The carrier concentration in each of the first light-extracting layer 111b and the second light-extracting layer 111d is $8 \times 10^{17}$ cm$^{-3}$ or lower.

A light-extracting structure 160 is formed on the surfaces of the first light-extracting layer 111b and the second light-extracting layer 111d (i.e., the bottom surfaces and the top surfaces of the recesses 110a and the protrusions 110b that form the terrace structure). No light-extracting structure (photonic crystal) 160 is provided in the regions where the Schottky electrodes 151 and the ohmic electrodes 152 are disposed. The light-extracting structure 160 has the same structure as that of the light-extracting structure 60 in the first embodiment of the invention, and no description of the light-extracting structure 160 will therefore be made.

In the second embodiment of the invention, the first current-spreading layer 111a and the second current-spreading layer 111c have resistance lower than that of the first light-extracting layer 111b and the second light-extracting layer 111d, as in the first embodiment of the invention. As a result, the first current-spreading layer 111a and the second current-spreading layer 111c can spread the current flowing from the ohmic electrodes 152 toward the reflective electrode 120 in the direction (horizontal direction) perpendicular to the direction in which the semiconductor film 110 has grown (vertical direction) in contrast with the first light-extracting layer 111b and the second light-extracting layer 111d. Specifically, the current can be spread. Further, the first light-extracting layer 111b and the second light-extracting layer 111d absorb light less than the first current-spreading layer 111a and the second current-spreading layer 111c. The amount of light absorption in the semiconductor film 110 can therefore be less than in a case where the n-type cladding layer 111 is formed only of the current-spreading layers described above.

As described above, the semiconductor light-emitting device 100 according to the second embodiment of the invention differs from the semiconductor light-emitting device according to the first embodiment of the invention in that the semiconductor material is GaN, that the terrace structure is formed only on the light-extracting surface side, and that the carrier confining layer 11a and the first current-spreading layer 11b in the first embodiment of the invention have the same composition and hence are replaced with the first current-spreading layer 111a in the second embodiment of the invention. Since the n-type cladding layer 111 employs the four-layer structure described above, the semiconductor light-emitting device 100 according to the second embodiment of the invention can still provide the same advantageous effects provided by the structure of the n-type cladding layer 11 in the semiconductor light-emitting device 1 according to the first embodiment of the invention.

FIGS. 13A and 13B show a semiconductor light-emitting device 200 made of GaN-based material but different from the semiconductor light-emitting device 100 in that the number of protrusions 110b and recesses 110a in the n-type cladding layer 111 is greater. In the semiconductor light-emitting device 200, the ohmic electrodes 152 are formed on the protrusions 110b to surround the recesses 110a. Further, the Schottky electrodes 151 are positioned in the outer periphery of the n-type cladding layer 111. In this case as well, since the n-type cladding layer 111 has the four-layer structure described above, the current flowing through the protrusions 110b can be spread toward the recesses 110a (i.e., in the horizontal direction), and the amount of light absorption in the semiconductor film 110 can be reduced.

In the embodiment described above, no counter electrode is formed, but a counter electrode may be formed as in the first embodiment of the invention. Further, recesses and protrusions may be formed also on the reflective surface side to form a terrace structure, as in the first embodiment of the invention.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2010-171779 which is hereby incorporated by reference.

What is claimed is:

1. A semiconductor light-emitting device comprising:
a reflective electrode provided on a support and forming a reflective surface;
a first cladding layer provided on said reflective electrode;
a light-emitting layer provided on said first cladding layer;
a second cladding layer provided on said light-emitting layer and having a terrace structure formed of recesses and protrusions, a light-extracting structure having projections and depressions being formed on top surfaces of said protrusions and bottom surfaces of said recesses; and
surface electrodes provided on the top surfaces of said protrusions,
wherein said second cladding layer has a stacked structure on said light-emitting layer, said stacked structure including a first current-spreading layer, a first light-extracting layer provided on said first current-spreading layer and having the light-extracting structure formed on the bottom surfaces of said recesses, a second current-spreading layer provided on said first light-extracting layer, and a second light-extracting layer provided on said second current-spreading layer and having said light-extracting structure formed on the top surfaces of said protrusions, and
said first light-extracting layer and said second light-extracting layer have lower light absorptance and higher resistance than said first current-spreading layer and said second current-spreading layer.

2. The semiconductor light-emitting device according to claim 1, wherein
said reflective electrode is provided in a region where said reflective electrode does not oppose to said surface electrodes in the direction in which said first cladding layer, said light-emitting layer, and said second cladding layer are stacked.

3. The semiconductor light-emitting device according to claim 1, wherein
each of said first light-extracting layer and said second light-extracting layer is made of an indirect-transition semiconductor material.

4. The semiconductor light-emitting device according to claim 3, wherein
each of said first light-extracting layer and said second light-extracting layer is made of an $(Al_zGa_{1-z})_xIn_{1-x}P$ semiconductor material and has an Al composition (z) of 0.7 or greater.

5. The semiconductor light-emitting device according to claim 1, wherein
each of said first current-spreading layer and said second current-spreading layer is made of an $(Al_zGa_{1-z})_xIn_{1-x}P$ semiconductor material having an Al composition (z) of 0.5 or lower and having a carrier concentration of $1 \times 10^{18}$ cm$^{-3}$ or higher.

6. The semiconductor light-emitting device according to claim 1, wherein
each of said first light-extracting layer and said second light-extracting layer has a carrier concentration of $1 \times 10^{18}$ cm$^{-3}$ or lower.

7. The semiconductor light-emitting device according to claim 1, wherein
each of said first current-spreading layer and said second current-spreading layer is made of a GaN-based semiconductor material and having a carrier concentration of $5 \times 10^{18}$ cm$^{-3}$ or higher.

8. The semiconductor light-emitting device according to claim 7, wherein
each of said first light-extracting layer and said second light-extracting layer is made of a GaN-based semiconductor material and has a carrier concentration of $8 \times 10^{17}$ cm$^{-3}$ or lower.

* * * * *